United States Patent
Coe-Sullivan et al.

(10) Patent No.: US 8,470,617 B2
(45) Date of Patent: Jun. 25, 2013

(54) COMPOSITION INCLUDING MATERIAL, METHODS OF DEPOSITING MATERIAL, ARTICLES INCLUDING SAME AND SYSTEMS FOR DEPOSITING MATERIAL

(75) Inventors: Seth Coe-Sullivan, Belmont, MA (US); Maria J. Anc, Groveland, MA (US); LeeAnn Kim, Dover, MA (US); John E. Ritter, Westford, MA (US); Marshall Cox, North Haven, CT (US); Craig Breen, Somerville, MA (US); Vladimir Bulovic, Lexington, MA (US); Ioannis Kymissis, New York, NY (US); Robert F. Praino, Jr., Westwood, MA (US); Peter T. Kazlas, Sudbury, MA (US)

(73) Assignee: QD Vision, Inc., Lexington, MA (US)

( * ) Notice: Subject to any disclaimer, the term of this patent is extended or adjusted under 35 U.S.C. 154(b) by 45 days.

(21) Appl. No.: 12/287,143

(22) Filed: Oct. 6, 2008

(65) Prior Publication Data
US 2009/0215208 A1    Aug. 27, 2009

Related U.S. Application Data

(63) Continuation of application No. PCT/US2007/008873, filed on Apr. 9, 2007.

(60) Provisional application No. 60/790,393, filed on Apr. 7, 2006, provisional application No. 60/792,170, filed on Apr. 14, 2006, provisional application No. 60/792,086, filed on Apr. 14, 2006.

(51) Int. Cl.
*H01L 21/00* (2006.01)

(52) U.S. Cl.
USPC .............................. 438/22; 438/669; 257/288

(58) Field of Classification Search
USPC ....................................... 438/22, 669; 257/288
See application file for complete search history.

(56) References Cited

U.S. PATENT DOCUMENTS

| | | | |
|---|---|---|---|
| 4,235,958 A | 11/1980 | Barraud et al. |
| 4,791,881 A | 12/1988 | Iwasaki |
| 484,400 A | 7/1989 | Yasui et al. |
| 4,844,002 A | 7/1989 | Yasui et al. |
| 4,948,635 A | 8/1990 | Iwasaki |
| 4,957,808 A | 9/1990 | Arai et al. |
| 5,099,256 A | 3/1992 | Anderson et al. |
| 5,512,131 A | 4/1996 | Kumar et al. |
| 5,537,000 A | 7/1996 | Alivisatos et al. |
| 5,559,057 A | 9/1996 | Goldstein |
| 5,574,291 A | 11/1996 | Dodabalapur et al. |

(Continued)

FOREIGN PATENT DOCUMENTS

| | | |
|---|---|---|
| EP | 0954205 | 3/1999 |
| EP | 1065725 | 3/2001 |

(Continued)

OTHER PUBLICATIONS

Adachi et al., Appl. Phys. Lett. 78, 1622 (2001).

(Continued)

*Primary Examiner* — Jarrett Stark
*Assistant Examiner* — Nicholas Tobergte

(57) ABSTRACT

Methods for depositing nanomaterial onto a substrate are disclosed. Also disclosed are compositions useful for depositing nanomaterial, methods of making devices including nanomaterials, and a system and devices useful for depositing nanomaterials.

35 Claims, 13 Drawing Sheets

U.S. PATENT DOCUMENTS

| | | | |
|---|---|---|---|
| 5,669,303 A | 9/1997 | Maracas et al. | |
| 5,755,883 A * | 5/1998 | Kinose et al. | 118/110 |
| 5,853,446 A * | 12/1998 | Carre et al. | 65/17.3 |
| 5,882,779 A | 3/1999 | Lawandy | |
| 5,900,160 A | 5/1999 | Whitesides et al. | |
| 5,937,758 A | 8/1999 | Maracas et al. | |
| 5,997,958 A | 12/1999 | Sato et al. | |
| 6,001,515 A | 12/1999 | Evans et al. | |
| 6,157,047 A | 12/2000 | Fujita et al. | |
| 6,180,239 B1 | 1/2001 | Whitesides et al. | |
| 6,239,355 B1 | 5/2001 | Salafsky | |
| 6,251,303 B1 | 6/2001 | Bawendi et al. | |
| 6,259,506 B1 | 7/2001 | Lawandy | |
| 6,276,266 B1 | 8/2001 | Dietz et al. | |
| 6,294,401 B1 | 9/2001 | Jacobson et al. | |
| 6,322,901 B1 | 11/2001 | Bawendi et al. | |
| 6,348,295 B1 | 2/2002 | Griffith et al. | |
| 6,410,416 B1 | 6/2002 | Dodabalapur et al. | |
| 6,420,200 B1 | 7/2002 | Yamazaki et al. | |
| 6,464,898 B1 | 10/2002 | Tomoike | |
| 6,470,904 B1 | 10/2002 | Tai et al. | |
| 6,494,570 B1 | 12/2002 | Snyder | |
| 6,518,168 B1 | 2/2003 | Clem et al. | |
| 6,544,808 B2 | 4/2003 | Hoon | |
| 6,576,291 B2 | 6/2003 | Bawendi et al. | |
| 6,593,690 B1 | 7/2003 | McCormick et al. | |
| 6,601,944 B1 | 8/2003 | Kawazoe | |
| 6,639,527 B2 | 10/2003 | Johnson et al. | |
| 6,669,801 B2 | 12/2003 | Yoshimura et al. | |
| 6,682,189 B2 | 1/2004 | May et al. | |
| 6,692,832 B2 | 2/2004 | Murphy | |
| 6,703,781 B2 | 3/2004 | Zovko | |
| 6,722,760 B2 | 4/2004 | Jeong et al. | |
| 6,730,356 B2 | 5/2004 | Kim et al. | |
| 6,732,643 B2 | 5/2004 | Kwon et al. | |
| 6,736,985 B1 | 5/2004 | Bao et al. | |
| 6,770,502 B2 | 8/2004 | Cok et al. | |
| 6,776,094 B1 | 8/2004 | Whitesides et al. | |
| 6,797,412 B1 | 9/2004 | Jain et al. | |
| 6,835,583 B2 | 12/2004 | Yi et al. | |
| 6,840,167 B2 | 1/2005 | Clark et al. | |
| 6,860,199 B2 | 3/2005 | Lee et al. | |
| 6,864,626 B1 | 3/2005 | Weiss et al. | |
| 6,875,704 B2 | 4/2005 | Baek et al. | |
| 6,887,332 B1 | 5/2005 | Kagan et al. | |
| 6,929,762 B2 | 8/2005 | Rubin | |
| 6,936,181 B2 | 8/2005 | Bulthaup et al. | |
| 6,946,332 B2 | 9/2005 | Loo et al. | |
| 6,957,608 B1 | 10/2005 | Hubert et al. | |
| 7,015,640 B2 | 3/2006 | Schaepkens et al. | |
| 7,067,328 B2 | 6/2006 | Dubrow et al. | |
| 7,115,216 B2 | 10/2006 | Carter et al. | |
| 7,160,613 B2 | 1/2007 | Bawendi et al. | |
| 7,232,771 B2 | 6/2007 | Jacobs et al. | |
| 7,253,452 B2 | 8/2007 | Steckel et al. | |
| 7,332,211 B1 | 2/2008 | Bulovic et al. | |
| 7,390,568 B2 | 6/2008 | Kim et al. | |
| 7,430,355 B2 | 9/2008 | Heikenfeld et al. | |
| 7,592,269 B2 | 9/2009 | Jacobs | |
| 7,615,179 B2 | 11/2009 | Dumond et al. | |
| 7,700,200 B2 | 4/2010 | Bulovic et al. | |
| 7,880,377 B2 | 2/2011 | Orita et al. | |
| 8,062,701 B2 | 11/2011 | McClure et al. | |
| 2001/0001050 A1 | 5/2001 | Miyashita et al. | |
| 2002/0001026 A1 | 1/2002 | Ishikawa et al. | |
| 2002/0047560 A1 | 4/2002 | Lee et al. | |
| 2002/0053320 A1 | 5/2002 | Duthaler et al. | |
| 2002/0074565 A1 | 6/2002 | Flagan et al. | |
| 2002/0075422 A1 | 6/2002 | Kimura et al. | |
| 2002/0187347 A1 | 12/2002 | Halas et al. | |
| 2003/0010241 A1 | 1/2003 | Fujihira et al. | |
| 2003/0035917 A1 | 2/2003 | Hyman | |
| 2003/0041444 A1 | 3/2003 | Debe et al. | |
| 2003/0042850 A1 | 3/2003 | Bertram et al. | |
| 2003/0047535 A1 | 3/2003 | Schueller et al. | |
| 2003/0054957 A1 | 3/2003 | Irvin et al. | |
| 2003/0067529 A1 | 4/2003 | May et al. | |
| 2003/0095170 A1 | 5/2003 | Johnson | |
| 2003/0103123 A1 | 6/2003 | Snyder | |
| 2003/0124260 A1 | 7/2003 | Baeck | |
| 2003/0124866 A1 | 7/2003 | Kim et al. | |
| 2003/0140982 A1 | 7/2003 | Seki et al. | |
| 2003/0152703 A1 | 8/2003 | Hammond et al. | |
| 2003/0156992 A1 | 8/2003 | Anderson et al. | |
| 2003/0160260 A1 | 8/2003 | Hirai et al. | |
| 2003/0175411 A1 | 9/2003 | Kodas et al. | |
| 2003/0186914 A1 | 10/2003 | Hofer et al. | |
| 2003/0213382 A1 | 11/2003 | Kendale et al. | |
| 2003/0219920 A1 | 11/2003 | Baek et al. | |
| 2003/0230970 A1 * | 12/2003 | Steckl et al. | 313/498 |
| 2004/0023010 A1 * | 2/2004 | Bulovic et al. | 428/209 |
| 2004/0027327 A1 | 2/2004 | LeCain et al. | |
| 2004/0028875 A1 | 2/2004 | Van Rijn et al. | |
| 2004/0091710 A1 | 5/2004 | Bawendi et al. | |
| 2004/0095658 A1 | 5/2004 | Buretea et al. | |
| 2004/0104660 A1 | 6/2004 | Okamoto et al. | |
| 2004/0108808 A1 | 6/2004 | Kumagai et al. | |
| 2004/0109057 A1 | 6/2004 | Pan et al. | |
| 2004/0110002 A1 | 6/2004 | Kim et al. | |
| 2004/0127135 A1 | 7/2004 | Baek et al. | |
| 2004/0137263 A1 | 7/2004 | Burn et al. | |
| 2004/0147113 A1 | 7/2004 | Yamazaki et al. | |
| 2004/0160154 A1 | 8/2004 | Nishimura et al. | |
| 2004/0166235 A1 | 8/2004 | Fujii et al. | |
| 2004/0173807 A1 | 9/2004 | Tian et al. | |
| 2004/0217696 A1 | 11/2004 | Kim et al. | |
| 2004/0265492 A1 | 12/2004 | Free et al. | |
| 2005/0009224 A1 | 1/2005 | Yang et al. | |
| 2005/0028691 A1 | 2/2005 | Baek | |
| 2005/0045900 A1 | 3/2005 | Silvernail | |
| 2005/0048295 A1 | 3/2005 | Kim et al. | |
| 2005/0058416 A1 | 3/2005 | Hoon Lee et al. | |
| 2005/0069644 A1 | 3/2005 | Hsieh et al. | |
| 2005/0072989 A1 | 4/2005 | Bawendi et al. | |
| 2005/0074589 A1 | 4/2005 | Pan et al. | |
| 2005/0081983 A1 | 4/2005 | Nakayama et al. | |
| 2005/0098205 A1 | 5/2005 | Roscheisen | |
| 2005/0117868 A1 | 6/2005 | Chen et al. | |
| 2005/0118338 A1 | 6/2005 | Stebe et al. | |
| 2005/0118403 A1 | 6/2005 | Anazawa et al. | |
| 2005/0126628 A1 | 6/2005 | Scher et al. | |
| 2005/0129867 A1 | 6/2005 | Picard et al. | |
| 2005/0146551 A1 | 7/2005 | Yamazaki et al. | |
| 2005/0147849 A1 | 7/2005 | Wolk | |
| 2005/0157157 A1 | 7/2005 | Tsukamoto et al. | |
| 2005/0163934 A1 | 7/2005 | Ruschak et al. | |
| 2005/0186363 A1 | 8/2005 | De Visser et al. | |
| 2005/0186405 A1 | 8/2005 | Jeong et al. | |
| 2005/0189883 A1 | 9/2005 | Suh et al. | |
| 2005/0191448 A1 | 9/2005 | Suh et al. | |
| 2005/0214536 A1 | 9/2005 | Schrier et al. | |
| 2005/0227063 A1 | 10/2005 | Lawandy | |
| 2005/0230356 A1 | 10/2005 | Empedocles et al. | |
| 2005/0241573 A1 | 11/2005 | Ogawa et al. | |
| 2005/0242346 A1 | 11/2005 | Forrest et al. | |
| 2005/0243233 A1 | 11/2005 | Kim | |
| 2005/0244990 A1 | 11/2005 | Kim | |
| 2005/0245085 A1 | 11/2005 | Yoo | |
| 2005/0249901 A1 | 11/2005 | Yializis et al. | |
| 2005/0250052 A1 | 11/2005 | Nguyen et al. | |
| 2005/0263025 A1 | 12/2005 | Blees | |
| 2005/0274944 A1 | 12/2005 | Jang | |
| 2006/0003097 A1 | 1/2006 | Andres et al. | |
| 2006/0021533 A1 | 2/2006 | Jeans | |
| 2006/0038182 A1 | 2/2006 | Rogers et al. | |
| 2006/0042685 A1 | 3/2006 | Wang | |
| 2006/0043361 A1 | 3/2006 | Lee et al. | |
| 2006/0063351 A1 | 3/2006 | Jain | |
| 2006/0081557 A1 | 4/2006 | Xu et al. | |
| 2006/0097264 A1 | 5/2006 | Kim et al. | |
| 2006/0141245 A1 | 6/2006 | Stellacci et al. | |
| 2006/0196375 A1 | 9/2006 | Coe-Sullivan et al. | |
| 2006/0197437 A1 | 9/2006 | Krummacher et al. | |
| 2006/0199096 A1 | 9/2006 | Keusseyan | |
| 2007/0001581 A1 | 1/2007 | Stasiak et al. | |
| 2007/0103068 A1 | 5/2007 | Bawendi et al. | |
| 2007/0200492 A1 | 8/2007 | Cok et al. | |

| | | | |
|---|---|---|---|
| 2007/0247061 | A1 | 10/2007 | Adamovich et al. |
| 2007/0257608 | A1 | 11/2007 | Tyan et al. |
| 2008/0001167 | A1* | 1/2008 | Coe-Sullivan et al. ....... 257/146 |
| 2008/0074050 | A1 | 3/2008 | Chen et al. |
| 2008/0169753 | A1 | 7/2008 | Skipor et al. |
| 2008/0172197 | A1 | 7/2008 | Skipor et al. |
| 2008/0238294 | A1 | 10/2008 | Xu et al. |
| 2008/0283269 | A1* | 11/2008 | Graham et al. ................. 174/98 |
| 2009/0017268 | A1 | 1/2009 | Skipor et al. |
| 2009/0039764 | A1 | 2/2009 | Cho et al. |
| 2009/0152567 | A1 | 6/2009 | Comerford et al. |
| 2009/0174022 | A1 | 7/2009 | Coe-Sullivan et al. |
| 2009/0181478 | A1 | 7/2009 | Cox et al. |
| 2009/0208753 | A1 | 8/2009 | Coe-Sullivan et al. |
| 2009/0215209 | A1 | 8/2009 | Anc et al. |
| 2009/0278141 | A1 | 11/2009 | Coe-Sullivan et al. |
| 2009/0280586 | A1 | 11/2009 | Coe-Sullivan |
| 2009/0283742 | A1 | 11/2009 | Coe-Sullivan et al. |
| 2009/0283778 | A1 | 11/2009 | Cpe-Sullivan et al. |
| 2009/0286338 | A1 | 11/2009 | Coe-Sullivan et al. |
| 2009/0320909 | A1 | 12/2009 | Arango et al. |
| 2010/0001256 | A1 | 1/2010 | Coe-Sullivan et al. |
| 2010/0014799 | A1 | 1/2010 | Bulovic et al. |
| 2010/0044635 | A1 | 2/2010 | Breen et al. |
| 2010/0044636 | A1 | 2/2010 | Ramprasad et al. |
| 2010/0051870 | A1 | 3/2010 | Ramprasad |
| 2010/0051901 | A1 | 3/2010 | Kazlas et al. |
| 2010/0132770 | A1 | 6/2010 | Beatty et al. |
| 2010/0134520 | A1 | 6/2010 | Coe-Sullivan et al. |
| 2010/0265307 | A1 | 10/2010 | Linton et al. |
| 2011/0095261 | A1 | 4/2011 | Kazlas et al. |
| 2011/0127932 | A1 | 6/2011 | Halper et al. |

FOREIGN PATENT DOCUMENTS

| | | |
|---|---|---|
| EP | 1424732 | 6/2004 |
| EP | 1442885 | 8/2004 |
| JP | 6286289 | 10/1994 |
| JP | 7156524 | 6/1995 |
| JP | 7156525 | 6/1995 |
| JP | 8034116 | 2/1996 |
| JP | 8072384 | 3/1996 |
| JP | 10186350 | 7/1998 |
| JP | 11340516 | 12/1999 |
| JP | 2000238402 | 9/2000 |
| JP | 2002192540 | 7/2002 |
| JP | 2003039399 | 2/2003 |
| JP | 2004071357 | 3/2004 |
| JP | 5116475 | 4/2005 |
| JP | 2005169912 | 6/2005 |
| JP | 2005305674 | 11/2005 |
| KR | 20040000011 | 1/2004 |
| KR | 20090073477 | 7/2009 |
| WO | WO-00/20916 | 4/2000 |
| WO | WO-02/091803 | 11/2002 |
| WO | WO-2004/004025 | 1/2004 |
| WO | WO-2006/047215 A3 | 5/2006 |
| WO | WO2006/088877 A1 | 8/2006 |
| WO | WO-2006/135435 A3 | 12/2006 |
| WO | WO-2007/117668 A3 | 10/2007 |
| WO | WO-2007/117672 A3 | 10/2007 |
| WO | WO-2007/117698 A3 | 10/2007 |
| WO | WO-2007/120877 A3 | 10/2007 |
| WO | WO2007/143197 A2 | 12/2007 |
| WO | WO2007/143197 A3 | 12/2007 |
| WO | WO-2008/105792 A3 | 9/2008 |
| WO | WO-2008/108798 A3 | 9/2008 |
| WO | WO-2008/111947 A1 | 9/2008 |

OTHER PUBLICATIONS

S. Coe, et al., "Electroluminescence from single monolayers of nanocrystals in molecular organic devices", Nature, vol. 420, No. 6917, pp. 800-803 (2002).
S. Coe-Sullivan, et al., "Large-area Ordered Quantum-dot Monolayers via Phase Separation During Spin-Casting", Advanced Functional Materials, 15, 1117-1124 (2005).
S. Coe-Sullivan, et al., "Method for fabrication of saturated RGB quantum dot light emitting devices". Proc. of SPIE vol. 5739, pp. 108-115 (2005).
Dabbousi et al., J. Phys. Chem. 101, 9463 (1997).
Dirr et al., Jpn. J. Appl. Phys. 37, 1457 (1998).
M. Gao, et al., "Lateral patterning of CdTe nanocrystal films by the electric field directed layer-by-layer assembly method", Langmuir, 2002, 18, 4098-4102.
L. Kim, et al., Contact Printing of Quantum Dot Light-emitting Devices, NANO Letters, 2008, vol. 8, No. 12, 4513-4517.
S. Kirstein et al., "Herringbone Structures in Two-Dimensional Single Crystals of Cyanine Dyes. I. Detailed Structure Analysis Using Electron Diffraction", J. Chem. Phys. 103(2) Jul. 1995, pp. 818 et seq.
S. Kirstein et al., "Herringbone Structures in Two-Dimensional Single Crystals of Cyanine Dyes. II. Optical Properties", J. Chem. Phys. 103(2) Jul. 1995, pp. 826 et seq.
A. Kumar and G. Whitesides, *Applied Physics Letters*, 63, 2002-2004, (1993).
T. Lee, "Organic light-emitting diodes formed by soft contact lamination", PNAS, Jan. 13, 2004, vol. 101, No. 2, 429-433.
X. Lin, et al, "Formation of Long-range-ordered Nanocrsytal Superlattices on Silicon Nitride Substrates", j. Phys. Chem. B 2001, 105, 3353-3357.
Matthew A. Meitl, et al., "Transfer Printing by Kinetic Control of Adhesion to an Elastomeric Stamp", Nature Materials 5, 33-38 (Jan. 1, 2006) Letters.
A. Mishra et al. "Cyanines During the 1990s: A Review", Chem. Rev. 2000, 100, 1973-2011.
C. Peyratout et al., Aggregation of Thiacyanine Derivatives on Polyelectrolytes:, Phys. Chem. Chem. Phys., 2002, 4, 3032-3039.
V. Santhanam and R. P. Andres, Nano Letters, 4, 41-44, (2004).
V. Santhanam, et al., Langmuir, 19, 7881-7887, (2003).
M. C. Schlamp, et al., J. Appl. Phys., 82, 5837-5842, (1997).
Alexander H. Tullo, "Printable electronics is attracting growing interest and is gearing up for commercial applications", Chemical & Engineering News, Feb. 13, 2006, vol. 84, No. 7, pp. 45-51.
X. Wu, et al., << Microcontact Printing of CdS/Dendrimer Nanocomposite Patterns on Silicon Wafters >>, Adv. Mater. Mar. 5, 2004, vol. 16, No. 5, pp. 413-417.
Yamasaki et al., Appl. Phys. Lett. 76, 1243 (2000).
J. Yu, et al., "Micropatterning metal electrode of organic light emitting devices using rapid polydimethylsiloxance lift-off", Appl. Phys. Lett., 91, 043102 (2007).
"Surface Modifying Reagents", United Chemical Technologies, Inc. (undated).
Z. Metali, "Connect the Quantum Dots for a Full-Colour Image", Nature/doi:10.1038/news.2011.109 (published online Feb. 20, 2011).
L. Savage, "Quantum Dots Set to Permeate the Next Generation of Displays", http://www.photonics.com/Article.aspx?AID=46864.
T.-H. Kim, Full-Colour Quantum Dot Displays Fabricated by Transfer Printing >>, Nature Photonics, doi:10.1038/NPHOTON.2011,12 (2011) (published online Feb. 20, 2011).
IPER for PCT/US2007/008873.
Thesis of Alexi Cosmos Arango entitled "A Quantum Dot Heterojunction Photodetector" Submitted to the Department of Electrical Engineering and Computer Science, in partial fulfillment of the requirements for the degree of Masters of Science in Computer Science and Engineering at the Massachusetts Institute of Technology, Feb. 2005.
Bulovic et al., Semiconductors and Semimetals 64, 255 (2000).
D'Andrade et al., MRS Fall Meeting, BB6.2 (2001).
IPER mailed Aug. 11, 2008 for PCT/US2007/09286.
Office Action mailed Nov. 14, 2011 in copending U.S. Appl. No. 12/287,270.
Office Action mailed Feb. 22, 2012 in copending U.S. Appl. No. 12/287,145.
Chan, Y., et al. 2004 Appl. Phys. Lett. vol. 85, No. 13, pp. 2460-2462.
Coe-Sullivan, S, et al, "Tuning the performance of hybrid organic/inorganic quantum dot light-emitting devices", Organic Electronics 4 (2003) 123-130.
Coe-Sullivan, S._MIT, PhD_Thesis_Jun. 2005, "Hybrid Organic/Quantum Dot Thin Film Structures and Devices".
Final Office Action, mailed Jul. 20, 2012 in copending U.S. Appl. No. 12/287,270.

Kohli, N., et al., <<Intact transfer of layered, bionanocomposite arrays by microcontact printing>>, Chem, Commun., 2005, 316-318.

Maenosono, Shinya; et al., "Overview of Nanoparticle Array Formation by Wet Coating", Journal of Nanoparticle Research 5:5-15, 2003.

Moeller, G., et al, "Quantum-dot light-emitting devices for displays", Information Display, Feb. 2006, pp. 2-6.

Kim, LeeAnn, Thesis entitled "Desposition of Colloidal Quantum Dots by Microcontact Printing for LED Display Technology", in partial fulfillment of the requirements for the degree of Masters of Engineering in Electrical Engineering and Computer Science, Massachusetts Institute of Technology, Feb. 2006.

* cited by examiner

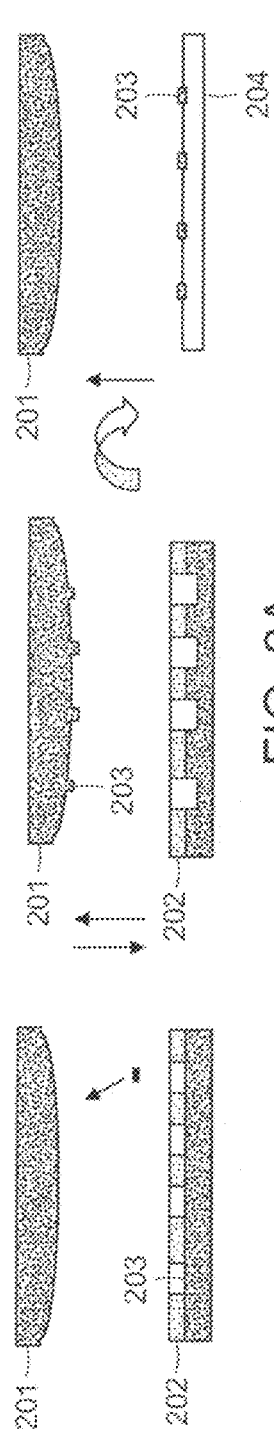
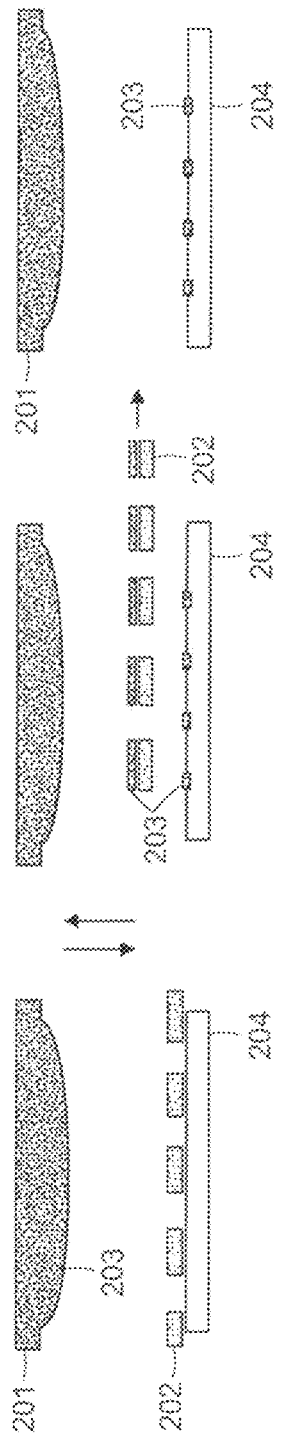

Examples of applicators: roller or stamp depending on the size.

Step 2. Layer (e.g., patterned or unpatterned) pick-up,
i.e. transfer onto the tape.

Step 3. Inked tape translation to the deposition site

Step 4. Deposition

COMPOSITION INCLUDING MATERIAL, METHODS OF DEPOSITING MATERIAL, ARTICLES INCLUDING SAME AND SYSTEMS FOR DEPOSITING MATERIAL

This application is a continuation of commonly owned PCT Application No. PCT/US2007/008873 filed 9 Apr. 2007, which was published in the English language as PCT Publication No. WO 2007/117698 on 18 Oct. 2007. The PCT Application claims priority from commonly owned U.S. Application Nos. 60/790,393 filed 7 Apr. 2006; 60/792,170 filed 14 Apr. 2006; and 60/792,086 filed 14 Apr. 2006. The disclosures of each of these applications are hereby incorporated herein by reference in their entireties.

TECHNICAL FIELD OF THE INVENTION

The invention relates to compositions and methods of depositing same. More particularly, the invention relates to compositions including nanomaterial, methods and systems for depositing same.

BACKGROUND OF THE INVENTION

A number of industries, e.g., electronics, displays, lighting, optoelectronics, and energy industries, rely on the formation of layers, coatings and/or patterns of materials to form pixels, circuits, and other features on substrates. The primary methods for generating these patterns are screen printing for features larger than about 100 microns and thin film and etching methods for features smaller than about 100 microns. Other subtractive methods to attain fine feature sizes include the use of photo-patternable pastes and laser trimming.

SUMMARY OF THE INVENTION

It has been recognized that it would be advantageous to develop improved methods, systems, devices, and compositions for depositing nanomaterials onto a substrate.

In accordance with one aspect of the invention, there is provided a method for depositing nanomaterial onto a substrate. The method includes applying a composition comprising nanomaterial to an applicator surface from a transfer surface, and contacting the applicator surface to the substrate.

In accordance with a further aspect of the invention, there is provided a method for depositing nanomaterial onto a substrate. The method includes applying nanomaterial to an applicator surface from a transfer surface, and contacting the applicator surface to the substrate.

In accordance with another aspect of the invention, there is provided a method for depositing nanomaterial onto a substrate. The method includes applying a layer comprising nanomaterial to an applicator surface from a transfer surface, and contacting the applicator surface to the substrate. The layer applied to the applicator can be patterned or unpatterned.

In accordance with a still further aspect of the invention, there is provided a method of depositing nanomaterial onto a substrate. The method includes applying a composition comprising nanomaterial and a carrier medium to a surface of an applicator from a transfer surface, and depositing at least a portion of the composition from the applicator onto the substrate.

In accordance with a still further aspect of the invention, there is provided a method for depositing a nanomaterial onto a substrate. The method comprises applying a composition comprising nanomaterial to an applicator surface; positioning a mask including a predetermined pattern of apertures comprising a predetermined shape and size on the substrate; and contacting the applicator surface to the substrate through at least a one of the apertures.

In accordance with another aspect of the invention, there is provided a method of depositing nanomaterial onto a substrate. The method includes introducing a composition comprising nanomaterial and liquid onto a transfer surface; transferring at least a portion of the composition from the transfer surface onto an applicator; removing at least a portion of the liquid from the composition; and depositing at least a portion of the at least partially liquid-free composition from the applicator onto the substrate.

In accordance with another aspect of the invention, there is provided a method of depositing nanomaterial onto a substrate. The method includes introducing a composition comprising nanomaterial and liquid onto a transfer surface; removing at least a portion of the liquid from the composition; transferring at least a portion of at least partially liquid-free composition from the transfer surface onto an applicator; and depositing at least a portion of the at least partially liquid-free composition from the applicator onto the substrate.

In accordance with a further aspect of the invention, there is provided a method for depositing nanomaterial onto a substrate. The method comprises introducing a composition comprising nanomaterial onto a transfer surface, and contacting a surface of the substrate with the transfer surface, and separating the substrate from the transfer surface.

In accordance with another aspect of the invention, there is provided a method of making a light emitting device. The method comprises applying a composition comprising semiconductor nanocrystals to an applicator surface from a transfer surface; and contacting the applicator surface to a substrate.

In accordance with another aspect of the invention, there is provided a method of forming a device comprising applying nanomaterial to a surface of an applicator from a transfer surface, contacting the surface of the applicator to a substrate including a first electrode, thereby transferring at least a portion of the nanomaterial onto the substrate; and arranging a second electrode opposed to the first electrode.

In accordance with yet another aspect of the invention, there is provided a system for depositing nanomaterial onto a substrate. The system comprises a transfer surface; means for dispensing a composition comprising nanomaterial onto the transfer surface, and means for depositing the composition from the transfer surface onto the substrate.

In accordance with yet another aspect of the invention, there is provided a composition useful for depositing nanomaterial onto a substrate. The composition includes nanomaterial. The composition can further include a carrier medium (e.g., liquid). Optionally, the composition can further include one or more additional components. In certain embodiments, nanomaterial comprises nanoparticles. Examples of nanoparticles include, for example, a semiconductor nanocrystal, a nanotube (such as a single walled or multi-walled carbon nanotube), a nanowire, a nanorod, a dendrimer, organic nanocrystal, organic small molecule, other nano-scale or micro-scale material or mixtures thereof.

In accordance with yet another aspect of the invention, there is provided an applicator made from a material comprising a silicon based elastomer (e.g., without limitation, PDMS) doped with a fluorinated polymer. In certain embodiments, the fluorinated polymer is included in the material in an amount greater than zero up to at least about 0.1 weight percent. In certain other embodiments, the fluorinated polymer can be included in an amount of at least about 0.001 weight percent. The amount of fluorinated polymer dopant can be included in the stamp material up to an amount that is less than the amount at which the silicon based elastomer including the fluorinated polymer dopant cannot be cured (e.g., forms an uncurable gel). In certain embodiments, the fluorinated polymer dopant comprises a fluorinated polysiloxane.

Other aspects of the invention include further articles and methods including deposited nanomaterial, systems, and devices for depositing compositions comprising nanomaterials.

The foregoing, and other aspects described herein all constitute embodiments of the present invention.

It is to be understood that both the foregoing general description and the following detailed description are exemplary and explanatory only and are not restrictive of the invention as claimed. Other embodiments will be apparent to those skilled in the art from consideration of the specification and practice of the invention disclosed herein.

BRIEF DESCRIPTION OF THE DRAWINGS

In the drawings:

FIGS. 2 A-B are diagrams depicting examples of embodiments including a mask.

Figure 1A:
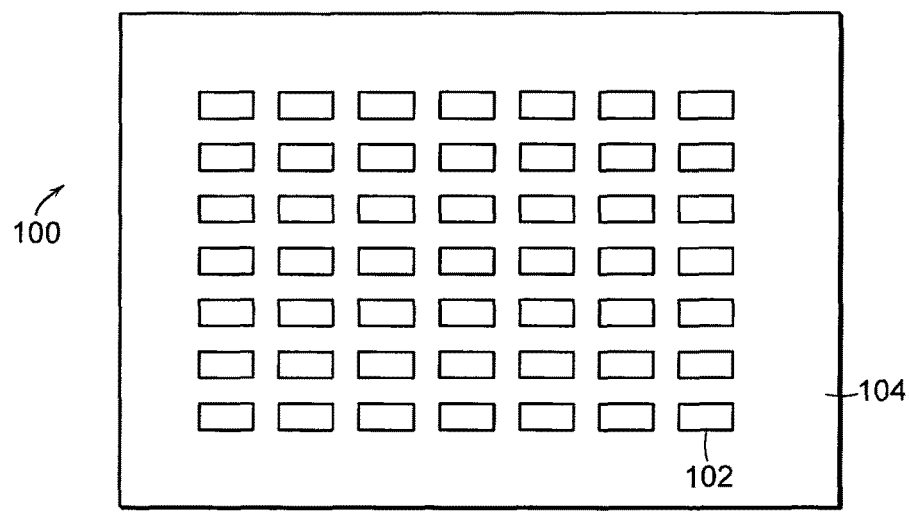
FIGS. 1 A-B are diagrams depicting examples of an embodiment of a transfer surface including a pattern of grooves.

The attached figures are simplified representations presented for purposed of illustration only; the actual structures may differ in numerous respects, including, e.g., relative scale, etc.

For a better understanding to the present invention, together with other advantages and capabilities thereof, reference is made to the following disclosure and appended claims in connection with the above-described drawings.

DETAILED DESCRIPTION OF THE INVENTION

One aspect of the invention relates to methods for depositing nanomaterial onto a substrate.

The nanomaterial can optionally be included in a composition. The composition can further include a liquid or other carrier medium. The composition can further include one or more additional components.

A nanomaterial typically includes nanoparticles having an average maximum dimension smaller than 100 nm.

Examples of nanoparticles include, for example, semiconductor nanocrystal, a nanotube (such as a single walled or multi-walled carbon nanotube), a nanowire, a nanorod, a dendrimer, organic nanocrystal, organic small molecule, other nano-scale or micro-scale material or mixtures thereof.

Nanomaterial particles can have various shapes, including, but not limited to, sphere, rod, disk, other shapes, and mixtures of various shaped particles.

Examples of organic nanocrystals include, without limitation, J-aggregates, H-aggregates, and organic nanocrystals including aggregates with other dipole arrangements. Examples of organic nanocrystals are described in S. Kirstein et al., "Herringbone Structures In Two-Dimensional Single Crystals of Cyanine Dyes. I. Detailed Structure Analysis Using Electron Diffraction", J. Chem. Phys. 103(2) July 1995, pages 816 et seq.; S. Kirstein et al., "Herringbone Structures In Two-Dimensional Single Crystals of Cyanine Dyes. II. Optical Properties", J. Chem. Phys. 103(2) July 1995, pages 826 et seq.; A. Mishra et al. "Cyanines During the 1990s: A Review", Chem. Rev. 2000, 100, 1973-2011; and C. Peyratout et al., "Aggregation of Thiacyanine Derivatives On Polyelectrolytes:, Phys. Chem. Chem. Phys., 2002, 4, 3032-3039, the disclosures of which are hereby incorporated herein by reference in their entireties.

The present invention will be useful for depositing nanomaterials, including, but not limited to, nanomaterials with optical and/or electronic characteristics, in patterned or unpatterned arrangements.

A nanomaterial can include one nanomaterial or a mixture of two or more different nanomaterials. Nanomaterials can be different based on, e.g. chemical composition, particle morphology (e.g., size, shape, surface area, particle size distribution, Full Width at Half-Maximum (FWHM), etc.), surface treatment(s) (e.g., not surface-modified, surface modified, and if surface modified, the details of the surface modification (e.g., composition, etc.)), particle structure (e.g., uncoated or coated; and if coated, the details of the coating, e.g., composition, thickness, nature of the coating (e.g., continuous, non-continuous, particulate, film, etc.)), performance characteristics (e.g., absorption properties, emission characteristics, etc.) of each nanomaterial, different combinations of chemical, physical, and/or performance aspects, etc.

In certain embodiments, nanomaterial includes semiconductor nanocrystals. Semiconductor nanocrystals comprise nanometer-scale inorganic semiconductor particles. Semiconductor nanocrystals preferably have an average nanocrystal diameter less than about 150 Angstroms (Å), and most preferably in the range of 12-150 Å.

In certain embodiments, inorganic semiconductor nanocrystals comprise Group IV elements, Group II-VI compounds, Group II-V compounds, Group III-VI compounds, Group III-V compounds, Group IV-VI compounds, Group I-III-VI compounds, Group II-IV-VI compounds, or Group II-IV-V compounds, alloys thereof and/or mixtures thereof, including ternary and quaternary alloys and/or mixtures. Examples include, but are not limited to, ZnO, ZnS, ZnSe, ZnTe, CdO, CdS, CdSe, CdTe, HgO, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbO, PbS, PbSe, PbTe, alloys thereof, and/or mixtures thereof, including ternary and quaternary alloys and/or mixtures.

In certain embodiments, semiconductor nanocrystals preferably include a "core" of one or more first semiconductor materials, which may be surrounded by an overcoating or "shell" of a second semiconductor material. A semiconductor nanocrystal core surrounded by a semiconductor shell is also referred to as a "core/shell" semiconductor nanocrystal.

For example, the semiconductor nanocrystal can include a core having the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof. Examples of materials suitable for use as semiconductor nanocrystal cores include, but are not limited to, CdS, CdO, CdSe, CdTe, ZnS, ZnO, ZnSe, ZnTe, MgTe, GaAs, GaP, GaSb, GaN, HgS, HgO, HgSe, HgTe, InAs, InP, InSb, InN, AlAs, AlP, AlSb, AlS, PbS, PbO, PbSe, Ge, Si, alloys thereof, and/or mixtures thereof, including ternary and quaternary alloys and/or mixtures. Other non-limiting examples are provided above. Examples of materials suitable for use as semiconductor nanocrystal shells include, but are not limited to, CdS, CdO, CdSe, CdTe, ZnS, ZnO, ZnSe, ZnTe, MgTe, GaAs, GaP, GaSb, GaN, HgS, HgO, HgSe, HgTe, InAs, InP, InSb, InN, AlAs, AlP, AlSb, AlS, PbS, PbO, PbSe, Ge, Si, alloys thereof, and/or mixtures thereof, including ternary and quaternary alloys and/or mixtures. Other non-limiting examples are provided above.

In certain embodiments, the surrounding "shell" material can have a bandgap greater than the bandgap of the core material. In certain embodiments, the shell can be chosen so as to have an atomic spacing close to that of the "core" substrate. In certain embodiments, the surrounding shell material can have a bandgap less than the bandgap of the core material. In a further embodiment, the shell and core materials can have the same crystal structure. Examples of semiconductor nanocrystals (core)shell structures include, without limitation: (CdSe)ZnS (core)shell, (CdZnSe)CdZnS (core)shell, and (CdS)CdZnS (core)shell.

For further examples of core/shell semiconductor structures, see U.S. application Ser. No. 10/638,546, entitled "Semiconductor Nanocrystal Heterostructures", filed 12 Aug. 2003, which is hereby incorporated herein by reference in its entirety.

The semiconductor nanocrystals are preferably members of a population of semiconductor nanocrystals having a narrow size distribution. More preferably, the semiconductor nanocrystals comprise a monodisperse or substantially monodisperse population of semiconductor nanocrystals. The monodisperse distribution of diameters can also be referred to as a size. In certain embodiments, the monodisperse population of semiconductor nanocrystals exhibits less than a 15% rms deviation in diameter of the nanocrystals, preferably less than 10%, more preferably less than 5%.

Methods of preparing monodisperse semiconductor nanocrystals include pyrolysis of organometallic reagents, such as dimethyl cadmium, injected into a hot, coordinating solvent. This permits discrete nucleation and results in the controlled growth of macroscopic quantities of nanocrystals. Preparation and manipulation of semiconductor nanocrystals are described, for example, in U.S. Pat. Nos. 6,322,901 and 6,576,291, and U.S. Patent Application No. 60/550,314, each of which is hereby incorporated herein by reference in its entirety. Additional examples of methods of preparing semiconductor nanocrystal are described in U.S. patent application Ser. No. 11/354,185 of Bawendi et al., entitled "Light Emitting Devices Including Semiconductor Nanocrystals", filed 15 Feb. 2006, and U.S. patent application Ser. No. 11/253,595 of Coe-Sullivan et al., entitled "Light Emitting Device Including Semiconductor Nanocrystals", filed 21 Oct. 2005, and U.S. patent application Ser. No. 10/638,546 of Kim et al., entitled "Semiconductor Nanocrystal Heterostructures", filed 12 Aug. 2003, referred to above, each of which is hereby incorporated by reference herein in its entirety.

One method of manufacturing a nanocrystal comprises a colloidal growth process. Colloidal growth occurs by rapidly injecting an M donor and an X donor into a hot coordinating solvent. The injection produces a nucleus that can be grown in a controlled manner to form a nanocrystal. The reaction mixture can be gently heated to grow and anneal the nanocrystal. Both the average size and the size distribution of the nanocrystals in a sample are dependent on the growth temperature. The growth temperature necessary to maintain steady growth increases with increasing average crystal size. The nanocrystal is a member of a population of nanocrystals. As a result of the discrete nucleation and controlled growth, the population of nanocrystals obtained has a narrow, monodisperse distribution of diameters. The monodisperse distribution of diameters can also be referred to as a size. The process of controlled growth and annealing of the nanocrystals in the coordinating solvent that follows nucleation can also result in uniform surface derivatization and regular core structures. As the size distribution sharpens, the temperature can be raised to maintain steady growth. By adding more M donor or X donor, the growth period can be shortened.

The M donor can be an inorganic compound, an organometallic compound, or elemental metal. M is cadmium, zinc, magnesium, mercury, aluminum, gallium, indium or thallium. The X donor is a compound capable of reacting with the M donor to form a material with the general formula MX. Typically, the X donor is a chalcogenide donor or a pnictide donor, such as a phosphine chalcogenide, a bis(silyl) chalcogenide, dioxygen, an ammonium salt, or a tris(silyl) pnictide. Suitable X donors include dioxygen, bis(trimethylsilyl) selenide (($TMS)_2Se$), trialkyl phosphine selenides such as (tri-n-octylphosphine) selenide (TOPSe) or (tri-n-butylphosphine) selenide (TBPSe), trialkyl phosphine tellurides such as (tri-n-octylphosphine) telluride (TOPTe) or hexapropylphosphorustriamide telluride (HPPTTe), bis(trimethylsilyl)telluride (($TMS)_2Te$), bis(trimethylsilyl)sulfide (($TMS)_2S$), a trialkyl phosphine sulfide such as (tri-n-octylphosphine) sulfide (TOPS), an ammonium salt such as an ammonium halide (e.g., $NH_4Cl$), tris(trimethylsilyl) phosphide (($TMS)_3P$), tris(trimethylsilyl) arsenide (($TMS)_3As$), or tris(trimethylsilyl) antimonide (($TMS)_3Sb$). In certain embodiments, the M donor and the X donor can be moieties within the same molecule.

A coordinating solvent can help control the growth of the nanocrystal. The coordinating solvent is a compound having a donor lone pair that, for example, has a lone electron pair available to coordinate to a surface of the growing nanocrystal. Solvent coordination can stabilize the growing nanocrystal. Typical coordinating solvents include alkyl phosphines, alkyl phosphine oxides, alkyl phosphonic acids, or alkyl phosphinic acids, however, other coordinating solvents, such as pyridines, furans, and amines may also be suitable for the nanocrystal production. Examples of suitable coordinating solvents include pyridine, tri-n-octyl phosphine (TOP), tri-n-octyl phosphine oxide (TOPO) and tris-hydroxylpropylphosphine (tHPP). Technical grade TOPO can be used. In certain embodiments, a non-coordinating solvent can be used.

Size distribution during the growth stage of the reaction can be estimated by monitoring the absorption line widths of the particles. Modification of the reaction temperature in response to changes in the absorption spectrum of the particles allows the maintenance of a sharp particle size distribution during growth. Reactants can be added to the nucleation solution during crystal growth to grow larger crystals. By stopping growth at a particular nanocrystal average diameter and choosing the proper composition of the semiconducting material, the emission spectra of the nanocrystals can be tuned continuously over the wavelength range of 300 nm to 5 microns, or from 400 nm to 800 nm for CdSe and CdTe. The nanocrystal has a diameter of less than 150 Å. A population of nanocrystals has average diameters in the range of 15 Å to 125 Å.

A semiconductor nanocrystal can have various shapes, including, but not limited to, sphere, rod, disk, other shapes, and mixtures of various shaped particles.

As discussed above, in certain embodiments, semiconductor nanocrystal can include a core/shell structure. In such embodiments, a semiconductor nanocrystal can include a core of a semiconductor material. A semiconductor nanocrystal core can comprise, for example, and without limitation, a semiconductor material represented by the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof. Other examples are provided elsewhere herein.

In embodiments including a core/shell structure, the core includes a shell (also referred to as an overcoating) on a surface of the core. The overcoating can be a semiconductor material having a composition different from the composition of the core. The overcoating of a semiconductor material on a surface of the nanocrystal core can include, for example, and without limitation, Group II-VI compounds, Group II-V compounds, Group III-VI compounds, Group III-V compounds, Group IV-VI compounds, Group I-III-VI compounds, Group II-IV-VI compounds, and Group II-IV-V compounds, for example, ZnO, ZnS, ZnSe, ZnTe, CdO, CdS, CdSe, CdTe, HgO, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbO, PbS, PbSe, PbTe, Si, Ge, alloys thereof and/or mixtures thereof. For example, ZnS, ZnSe or CdS overcoatings can be grown on CdSe or CdTe nanocrystals. An overcoating process is described, for example, in U.S. Pat. No. 6,322,901. By adjusting the temperature of the reaction mixture during overcoating and monitoring the absorption spectrum of the core, over coated materials having high emission quantum efficiencies and narrow size distributions can be obtained. In certain embodiments, the overcoating can be between 1 and 10 monolayers thick.

The particle size distribution can be further refined by size selective precipitation with a poor solvent for the nanocrystals, such as methanol/butanol as described in U.S. Pat. No. 6,322,901. For example, nanocrystals can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected nanocrystal population can have no more than a 15% rms deviation from mean diameter, preferably 10% rms deviation or less, and more preferably 5% rms deviation or less.

In certain embodiments, semiconductor nanocrystals are optionally surface modified, including, but not limited to, for example, having one or more ligand groups attached thereto.

In one embodiment, the ligands are derived from the coordinating solvent used during the growth process. The surface can be modified by repeated exposure to an excess of a competing coordinating group to form an overlayer. For example, a dispersion of the capped semiconductor nanocrystal can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the semiconductor nanocrystal, including, for example, phosphines, thiols, amines and phosphates. The semiconductor nanocrystal can be exposed to short chain polymers which exhibit an affinity for the surface and which terminate in a moiety having an affinity for a suspension or dispersion medium. Such affinity improves the stability of the suspension and discourages flocculation of the semiconductor nanocrystal. Nanocrystal outer layers are described in U.S. Pat. No. 6,251,303, which is incorporated by reference in its entirety.

More specifically, the coordinating ligand can have the formula:

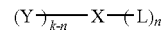

wherein k is 2, 3 or 5, and n is 1, 2, 3, 4 or 5 such that k–n is not less than zero; X is O, S, S=O, SO$_2$, Se, Se=O, N, N=O, P, P=O, As, or As=O; each of Y and L, independently, is aryl, heteroaryl, or a straight or branched C$_{2-12}$ hydrocarbon chain optionally containing at least one double bond, at least one triple bond, or at least one double bond and one triple bond. The hydrocarbon chain can be optionally substituted with one or more C$_{1-4}$ alkyl, C$_{2-4}$ alkenyl, C$_{2-4}$ alkynyl, C$_{1-4}$ alkoxy, hydroxyl, halo, amino, nitro, cyano, C$_{3-5}$ cycloalkyl, 3-5 membered heterocycloalkyl, aryl, heteroaryl, C$_{1-4}$ alkylcarbonyloxy, C$_{1-4}$ alkyloxycarbonyl, C$_{1-4}$ alkylcarbonyl, or formyl. The hydrocarbon chain can also be optionally interrupted by —O—, —S—, —N(R$^a$)—, —N(R$^a$)—C(O)—O—, —O—C(O)—N(R$^a$)—, —N(R$^a$)—C(O)—N(R$^b$)—, —O—C(O)—O—, —P(R$^a$)—, or —P(O)(R$^a$)—. Each of R$^a$ and R$^b$, independently, is hydrogen, alkyl, alkenyl, alkynyl, alkoxy, hydroxyalkyl, hydroxyl, or haloalkyl. An aryl group is a substituted or unsubstituted cyclic aromatic group. Examples include phenyl, benzyl, naphthyl, tolyl, anthracyl, nitrophenyl, or halophenyl. A heteroaryl group is an aryl group with one or more heteroatoms in the ring, for instance furyl, pyiridyl, pyrrolyl, phenanthryl.

A suitable coordinating ligand can be purchased commercially or prepared by ordinary synthetic organic techniques, for example, as described in J. March, Advanced Organic Chemistry, which is incorporated herein by reference in its entirety. See also U.S. patent application Ser. No. 10/641,292 entitled "Stabilized Semiconductor Nanocrystals", filed 15 Aug. 2003, which is hereby incorporated herein by reference in its entirety. See also other patents and patent applications referenced herein for additional descriptions of preparation methods.

Transmission electron microscopy (TEM) can provide information about the size, shape, and distribution of the nanocrystal population. Powder X-ray diffraction (XRD) patterns can provide the most complete information regarding the type and quality of the crystal structure of the nanocrystals. Estimates of size are also possible since particle diameter is inversely related, via the X-ray coherence length, to the peak width. For example, the diameter of the nanocrystal can be measured directly by transmission electron microscopy or estimated from X-ray diffraction data using, for example, the Scherrer equation. It also can be estimated from the UV/Vis absorption spectrum.

As discussed above, certain embodiments of a composition can include nanomaterial and a carrier medium (e.g., liquid, polymer, monomer, polymer or monomer solution, etc.). In certain embodiments, a carrier medium can be one in which the nanomaterial does not dissolve or does not appreciably dissolve (e.g., solubility is less than 0.001 mg/ml). In certain embodiments including a nanomaterial with one or more attached ligands, the carrier medium can be one in which the ligand not soluble or not appreciably soluble. In other embodiments, the medium can be one in which the ligand is at least partially soluble.

Examples of a liquid component for inclusion in compositions including nanomaterial (e.g, without limitation, semiconductor nanocrystals) includes, without limitation, those listed in the following Table 1, and mixtures of two or more thereof. Examples of mixtures include hexane and octane; benzene and xylene; tetrahydrofurane and anisole; etc.

TABLE 1

| Liquid | Formula | Viscosity @25° C. | Boiling Point @1 atm | Relative Polarity (compared to water) |
|---|---|---|---|---|
| cyclohexane | $C_6H_{12}$ | 0.89 | 80.7 | 0.006 |
| pentane | $C_5H_{12}$ | 0.24 | 36.1 | 0.009 |
| hexane | $C_6H_{14}$ | 0.30 | 69 | 0.009 |
| heptane | $C_7H_{16}$ | 0.91 | 98 | 0.012 |
| carbon tetrachloride | $CCl_4$ | 0.91 | 76.7 | 0.052 |
| p-xylene | $C_8H_{10}$ | 0.63 | 138.3 | 0.074 |
| toluene | $C_7H_8$ | 0.56 | 110.6 | 0.099 |
| benzene | $C_6H_6$ | 0.60 | 80.1 | 0.111 |
| diethyl ether | $C_4H_{10}O$ | 0.22 | 34.6 | 0.117 |
| methyl t-butyl alcohol | $C_5H_{12}O$ | | 55.2 | 0.148 |
| dioxane | $C_4H_8O_2$ | 1.21 | 101.1 | 0.164 |
| tetrahydrofurane (THF) | $C_4H_8O$ | 0.47 | 66 | 0.207 |
| ethyl acetate | $C_4H_8O_2$ | | 77 | 0.228 |
| dimethoxy-ethane (glyme) | $C_4H_{10}O_2$ | | 85 | 0.231 |
| diglyme | $C_6H_{14}O_3$ | | 162 | 0.244 |
| chloroform | $CHCl_3$ | 0.54 | 61.2 | 0.259 |
| methylene chloride | $CH_2Cl_2$ | 0.43 | 39.8 | 0.309 |
| 2-butanone | $C_4H_8O$ | | 79.6 | 0.327 |
| acetone | $C_3H_6O$ | 0.31 | 56.2 | 0.355 |
| t-butyl alcohol | $C_4H_{10}O$ | | 82.2 | 0.389 |
| dimethyl-formamide (DMF) | $C_3H_7NO$ | | 153 | 0.404 |
| dimethyl sulfoxide (DMSO) | $C_2H_6OS$ | | 189 | 0.444 |
| acetonitrile | $C_2H_3N$ | 0.35 | 81.6 | 0.46 |
| 2-propanol | $C_3H_8O$ | 2.40 | 82.4 | 0.546 |
| 1-butanol | $C_4H_{10}O$ | 3.00 | 117.6 | 0.602 |
| 1-propanol | $C_3H_8O$ | 1.95 | 97 | 0.617 |
| acetic acid | $C_2H_4O_2$ | | 118 | 0.648 |
| ethanol | $C_2H_6O$ | 1.20 | 78.5 | 0.654 |
| diethylene glycol | $C_4H_{10}O_3$ | 35.70 | 245 | 0.713 |
| methanol | $CH_4O$ | 0.59 | 64.6 | 0.762 |
| ethylene glycol | $C_2H_6O_2$ | 16.90 | 197 | 0.79 |
| glycerin | $C_3H_8O_3$ | 1410.00 | 290 | 0.812 |
| water, heavy (D2O) | $D_2O$ | | 101.3 | 0.991 |
| water | $H_2O$ | 1.00 | 100 | 1 |
| Nonane | $(CH_3(CH_2)_7CH_3)$ | 0.67 | 39.0 | |
| Decane | $C_{10}H_{22}$ | 0.84 | 174.1 | |
| Dodecane | $C_{12}H_{26}$ | 1.25 | 216.2 | |
| Chlorobenzene | $C_6H_5Cl$ | 0.75 | 132 | |
| Dichlorobenzene | $C_6H_4Cl_2$ | — | 174.0 | |
| Anisole | $C_7H_8O$ | 0.92 | 154.0 | |
| Dimethyl formamide | $HCON(CH_3)_2$ | 0.79 | 149.56 | |
| 1-Methyl-2-pyrrolidinone | | 1.7 | 204.5 | |
| Carbon tetrachloride | $CCl_4$ | 0.91 | 76.8 | |
| 1,1,1-Trichloroethane | $CH_3CCl_3$ | 0.73 | 74.0 | |
| Tetrachloroethylene | $ClCH=CCl_2$ | 0.57 | 87.0 | |
| Ethylbenzene | $C_8H_{10}$ | 0.67 | 136.0 | |

Other liquids or mixtures of liquids can be used. In certain embodiments, volatile liquids or mixtures of volatile liquids can be used.

In certain embodiments, a composition including nanomaterial and a liquid has a viscosity in a range of from about 0.1 centipoise (e.g., that of diethyl ether, methanol) to greater than 1500 centipoise (e.g., that of oils, glycerol). A composition including a nanomaterial and liquid may also be referred to as an ink.

In embodiments including nanomaterial comprising semiconductor nanocrystals, a preferred liquid comprises an organic non-polar solvent. More preferably, such carrier has a viscosity less than or equal to about 1 cP and also relatively high volatility.

Optionally, other components can be included in the composition. Examples of other components that can be optionally included in the composition include, but are not limited to, e.g., surfactants, solvents, co-solvents, buffers, biocides, viscosity modifiers, complexing agents, chelating agents, stabilizing agents (e.g., to inhibit agglomeration of the nanomaterial), humectants etc. Other possible components include other additives of the type that may be included in ink or inkjet ink compositions. Stabilizing agents can include, e.g., chemically attached functional groups or ligands to form a coating around individual nanoparticles.

The amount (e.g., concentration (wt/vol)) of nanomaterial included in a composition can be selected based upon the particular nanomaterial and desired attributes of the deposited nanomaterial (e.g., thickness, optical density, features of the deposited nanomaterial (e.g., patterned or unpatterned, sizes of the features of a pattern, etc.)). The amount can be readily determined by a person of ordinary skill in the art.

For example, in certain embodiments of compositions including semiconductor nanocrystals and a carrier medium (including, e.g., but not limited to, a liquid comprising non-polar organic solvent or solvent mixture), the composition includes at least about 0.1 mg/ml semiconductor nanocrystals and/or composition. In examples of other embodiments, the composition can include at least 1 mg/ml, at least 5 mg/ml, at least 10 mg/ml, at least 25 mg/ml; at least 50 mg/ml, etc.

In certain preferred embodiments, the nanomaterial and any other optional solid components are dispersed in the composition when introduced onto the transfer surface. In certain preferred embodiments, the dispersion is colloidal.

In accordance with one aspect of the invention, there is provided a composition useful for depositing nanomaterial onto a substrate. The composition includes nanomaterial. The composition can further include a carrier medium (e.g., without limitation, liquid, polymer, monomer, polymer or monomer solution, etc.). Optionally, the composition can further include one or more additional components. In certain embodiments, nanomaterial comprises nanoparticles.

Methods in accordance with the invention allow deposition of one or more nanomaterials and/or one or more compositions including nanomaterial onto a substrate. Such nanomaterial(s) and/or composition(s) can be deposited onto the substrate in a patterned or unpatterned arrangement.

Methods in accordance with the invention are particularly useful for applying one or more nanomaterials to a predefined region of a substrate, which may optionally include other materials, layers, components, and/or structures disposed thereon. As discussed above, nanomaterial can also be deposited with additional components included in a composition.

The predefined region is a region on the substrate where the nanomaterial can be selectively applied. The nanomaterial and surface can be chosen such that the nanomaterial remains substantially entirely within the predetermined area. Nanomaterial can be deposited onto the substrate such that the nanomaterial forms an unpatterned layer comprising nanomaterial within the predetermined area or a pattern comprising nanomaterial within the predetermined area. The pattern can be a regular pattern (such as an array, or a series of lines), or an irregular pattern.

Once one or more nanomaterials are deposited onto the substrate, the substrate can have a region including the nanomaterial (the predefined region) and a region substantially free of nanomaterial. In some circumstances, the one or more nanomaterials are deposited onto the substrate at a thickness of about a monolayer. In some circumstances, the thickness can be greater than a monolayer. The predefined region can be a discontinuous region. In other words, when the one or more nanomaterials are deposited onto the predefined region of the substrate, locations including nanomaterial can be separated by other locations that are substantially free of nanomaterial.

See, for example, A. Kumar and G. Whitesides, *Applied Physics Letters*, 63, 2002-2004, (1993); and V. Santhanam and R. P. Andres, *Nano Letters*, 4, 41-44, (2004), each of which is incorporated by reference in its entirety. See also U.S. patent application Ser. No. 11/253,612, filed 21 Oct. 2005, entitled "Method And System For Transferring A Patterned Material", of Coe-Sullivan et al. and U.S. patent application Ser. No. 11/253,595, filed 21 Oct. 2005, entitled "Light Emitting Device Including Semiconductor Nanocrystals," of Coe-Sullivan, each of which is incorporated herein by reference in its entirety.

When deposited in a patterned arrangement, nanomaterial can be deposited in a pattern comprising features having at least one dimension at a micron-scale (e.g., less than 1 mm, less than 500 µm, less than 200 µm, less than 100 µm or less, less than 50 µm or less, less than 20 µm or less, or less than 10 µm or less). Nanomaterial can also be deposited in a patterned arrangement comprising features at greater than micron-scale.

A pattern comprising deposited nanomaterial having features on the micron scale may also be referred to herein as a micropattern.

For example, a micropattern including 10-20 µm size features can be useful in light emitting device applications including, e.g., semiconductor nanocrystals.

The surface on which the nanomaterial can be deposited can have dimensions of 1 cm or greater, 10 cm or greater, 100 cm or greater, or 1,000 cm or greater.

Methods in accordance with the invention are scalable and can be useful in depositing a pattern comprising one or more nanomaterials over a wide range of surface areas.

For example, the method is useful for depositing nanomaterial over very small areas (for example, 100 µm catheters) to very large areas, (for example, 12" square areas). In further example, the method is also useful for depositing nanomaterial over surfaces with dimensions such as GEN2 (360 mm×465 mm), GEN3 (550 mm×650 mm), GEN3.5 (600 mm×720 mm), GEN4 (730 mm×920 mm), GEN5 (1110 mm×1250 mm), GEN6 (1500 mm×1800 mm), GEN7 (1900 mm×2100 mm), and subsequent generations of glass that can be used, e.g., in displays. Optionally, areas onto which nanomaterial is applied can then be stitched (or tiled) together, to expand the printable area from 12" squares, to 'n×12" squares' as is frequently done in the semiconductor lithography field.

In accordance with one aspect of the invention, a method of depositing nanomaterial onto a substrate includes applying a composition comprising nanomaterial to an applicator surface from a transfer surface; and contacting the applicator surface to a substrate to deposit the one or more nanomaterials thereto.

As discussed above, in addition to nanomaterial, a composition can further include liquid or another carrier medium. Optionally, a composition can further include other components.

In accordance with another aspect of the invention, there is provided a method for depositing nanomaterial onto a substrate. The method includes applying nanomaterial to an applicator surface from a transfer surface, and contacting the applicator surface to the substrate. The nanomaterial included on the applicator can be patterned or unpatterned. A pattern can comprise an array of individual features at least one of which comprises nanomaterials. Typically, the individual features are spaced apart from each other. In certain embodiments, however, the features could be in contact with each other or even overlap.

In accordance with a further aspect of the invention, there is provided a method for depositing nanomaterial onto a substrate. The method includes applying a layer comprising nanomaterial to an applicator surface from a transfer surface, and contacting the applicator surface to the substrate to deposit at least a portion of nanomaterial thereto. The layer including nanomaterial applied to the applicator can be patterned or unpatterned As discussed above, nanomaterial deposited by a method in accordance with the invention can include one or more nanomaterials, including, e.g., a mixture of two or more different nanomaterials. When nanomaterial is included in a composition, and two or more nanomaterials are to be deposited, different compositions including one or more different nanomaterials can be used.

If two or more different nanomaterials or mixtures of nanomaterials are to be deposited onto a substrate, for example, the method can include applying different nanomaterials and/or mixtures of nanomaterials to an applicator surface from a transfer surface in a single application step and a single deposition step. In another embodiment, the method can include applying different compositions including different nanomaterials and/or mixtures of nanomaterials to an applicator surface from a transfer surface in a single application step and a single deposition step.

In another example, the method can include applying different nanomaterials and/or mixtures of nanomaterials to an applicator surface from separate transfer surfaces in more than one application step and a single deposition step. In another example, the method can include applying different compositions including different nanomaterials and/or mixtures of nanomaterials to an applicator surface from separate transfer surfaces in more than one application step and a single deposition step.

In an additional example, the method can include applying different nanomaterials and/or mixtures of nanomaterials to separate applicators (e.g., from separate transfer surfaces, from a transfer surface that is clean and refilled between applications of nanomaterials to separate applicators, etc.) and separate deposition steps. In another example, the method can include applying different compositions including different nanomaterials and/or mixtures of nanomaterials to separate applicators (e.g., from separate transfer surfaces, from a transfer surface that is clean and refilled between applications of compositions to the separate applicators, etc.) and separate deposition steps. Other variations, including, for example, inclusion of optional additional steps are also contemplated.

If a composition includes liquid, in certain embodiments, all or substantially all of the liquid can be removed from the composition after the composition is applied to the applicator surface. This allows the nanomaterial and any optional non-liquid components of a composition to be deposited onto the substrate by a dry (e.g., liquid-free or substantially liquid-free) transfer. A method including a dry transfer of nanomaterials onto the substrate can be advantageous when a liquid included in a composition can dissolve or otherwise react with the substrate.

A dry transfer process is preferred, for example, when transferring a composition including semiconductor nanocrystals from an applicator to an organic layer of a light-emitting device structure during device fabrication.

If interaction between the substrate and a liquid component is not a concern, the composition can be deposited onto the substrate without prior removal the liquid therefrom. The liquid can be removed after deposition of the composition(s) onto the substrate.

If a wet transfer is desired, and the liquid is appreciably volatile at ambient conditions, the time between application of composition(s) to the applicator surface and deposition thereof onto the substrate is controlled to allow the deposition to occur while the composition(s) includes at least an amount of liquid.

In certain embodiments of the invention, a method of depositing one or more nanomaterials onto a substrate includes applying one or more liquid-free or substantially liquid-free nanomaterials to an applicator from a transfer surface; and depositing at least a portion of the nanomaterials from the applicator onto the substrate.

This aspect of the invention can be particularly advantageous when depositing one or more nanomaterials onto a substrate in a predetermined pattern. By including a transfer of nanomaterial(s) from the transfer surface to the applicator in the absence of a liquid component, blurring or distortion of patterned nanomaterial on the applicator surface can be reduced. Such blurring or distortion can occur, for example, when the liquid including nanomaterial spreads on or wets the applicator surface.

A transfer surface can be planar or contoured. A transfer surface can be rigid or flexible.

A transfer surface can be featureless or smooth (e.g. without elevations and/or depressions (e.g., grooves, recessed wells, etc.). A smooth transfer surface can be useful, for example, in a method for depositing an unpatterned layer onto a substrate. Examples of other embodiments including a smooth transfer surface are described below.

A transfer surface can include one or more features (e.g., elevations and/or depressions (e.g., grooves, recessed wells, other three-dimensional features, etc.)). The arrangement of features can correspond to a predetermined pattern to be deposited onto a substrate. For example, in certain embodiments, a transfer surface including one or more depressions (e.g., grooves, recessed wells, other three dimensional features, etc.) can be useful, for example, in a method for depositing a pattern comprising one or more nanomaterials onto a substrate. A transfer surface including elevated features can also be useful for depositing a pattern onto a substrate. For example, a composition including nanomaterial disposed on the elevated features of the transfer surface can be picked up with an applicator in the predetermined pattern and deposited onto the substrate.

A transfer surface can include a planar surface. A transfer surface can include a non-planar surface.

Examples of transfer surfaces include, without limitation, a plate including a flat section of material (metallic, polymeric, silicon, for example), that can be smooth or include one or more depressions (e.g., a flat cliché), a roller (e.g., with a circular, elliptical, or other rounded cross-section) including a predetermined pattern, a roller shaped transfer surface with a smooth surface (e.g., a roller shaped cliché), etc.

One type of transfer surface useful in the present invention is known in the art as a cliché. Other types of transfer surfaces can also be readily identified and used.

In certain embodiments, a rigid transfer surface is preferred.

In certain embodiments, the transfer surface is made of polymer lined steel, thin (~1 mm) steel sheet or thick (~10 mm) steel plate. Other materials that can be used to fabricate a transfer surface include metal (e.g., aluminum, etc.) metal alloys, silicon, glass, ceramic, etc. Preferably, the transfer surface is fabricated from steel plate.

In embodiments of transfer surfaces including one or more grooves, the shape of the grooves can be rectangular or another geometric shape such as lines, square, triangular, circular, semi-circular, elliptical, semi-elliptical, other geometrical shapes, irregular shapes, customized shapes, etc. The grooves can have the same shape or may include any number of different combinations of geometrical, irregular, customized, etc. shapes, for example.

The dimensions of a groove, for example, can optionally be on a micron scale (e.g., less than 1 mm, less than 500 µm, less than 200 µm, less than 100 µm, less than 50 µm, or 20 µm, 10 µm or less), or on a millimeter-scale or on a centimeter-scale or larger. Larger or smaller dimension grooves can also be used, depending on the predetermined pattern to be applied to substrate.

For example, the depth of a groove may be 0.01 µm (10 nm) to 100 µm, but is typically 25 µm in depth.

In embodiments of a transfer surface including two or more grooves, the grooves can be arranged in a pattern.

In embodiments of a transfer surface including depressions (e.g., grooves, recessed wells, other three dimension features, etc.) arranged in a pattern, the size, shape, and arrangement of the patterned depressions in a transfer surface can be designed so as to correspond to a predetermined pattern to be deposited onto the substrate. The depth and contour of the depressions in the transfer surface are also designed to produce the predetermined pattern to be deposited on the substrate.

For example, use of a transfer surface including a predetermined pattern of elevations or depressions (e.g., grooves, recessed wells, other three dimensional features, etc.) will permit the transfer of a predetermined pattern from the transfer surface to the applicator surface. A pattern can be formed on a transfer surface by, for example, etching, general photolithography, or other known techniques in the relevant art.

Figure 1B:
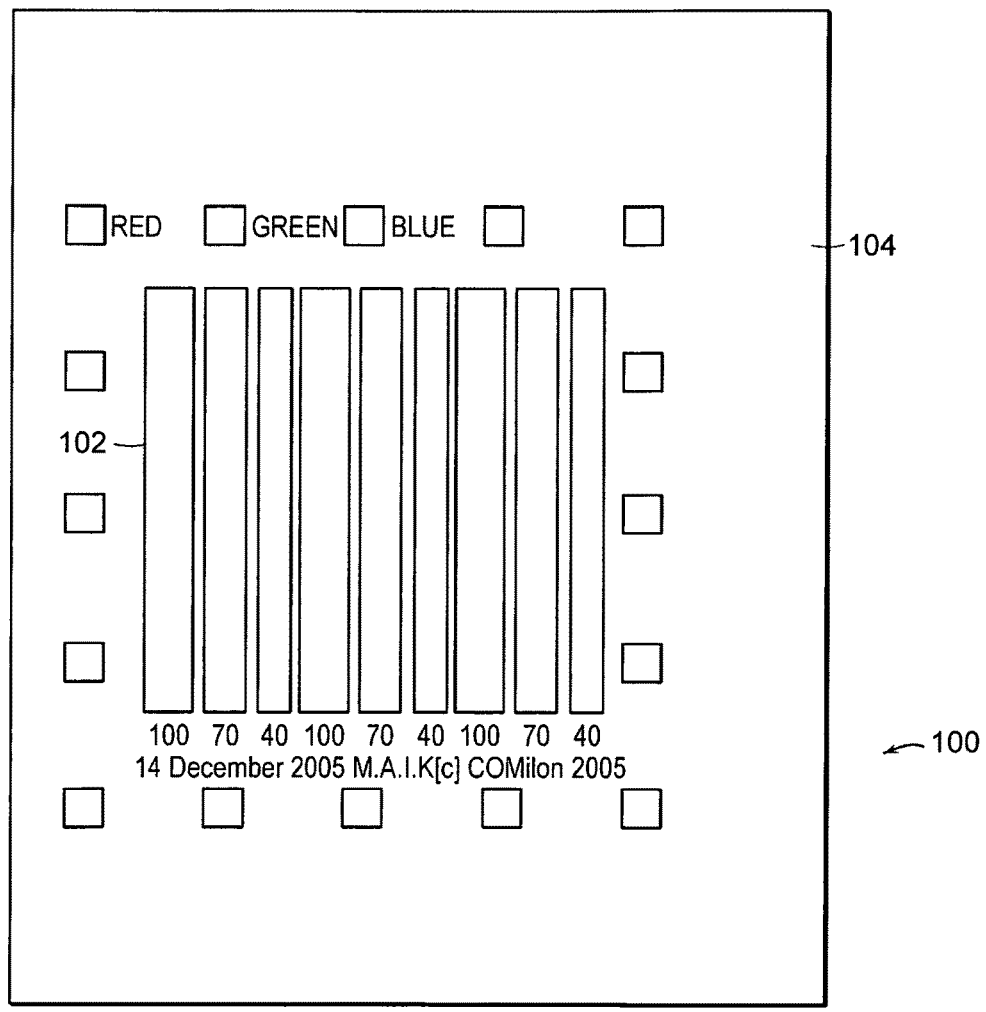

FIG. 1 A illustrates a plan view of an example of a cliché 100. As shown, a pattern of rectangular shaped grooves 102 is formed in the surface 104 of the cliché. Although the figure depicts rectangular shaped grooves, as discussed above, the shape, size, arrangement, depth, and contour of the grooves are selected based on the predetermined pattern to be deposited onto the substrate.

FIG. 1 B illustrates a plan view of another example of a cliché 100. As shown, the pattern of line-shaped grooves 102 is formed in the surface 104 of the cliché. The cliché includes a pattern of lines with different widths and different spacings. The figure contemplates that the cliché grooves will be filled with three different colored compositions (e.g., red, green, and blue). Optionally, fewer or more different compositions can be included in the grooves.

When a transfer surface includes a pattern of grooves, nanomaterial, and/or a composition including nanomaterial, can be introduced into one or more grooves in accordance with depositing the predetermined pattern including nanomaterial onto a substrate. The one or more nanomaterials or compositions can be included in at least a portion of a groove in accordance with the individual features of the predetermined pattern to be deposited on a substrate. As discussed above, the nanomaterial and/or composition included in the various grooves can be the same or different.

When an applicator is contacted (e.g., by pressing) to the transfer surface and thereafter separated therefrom, the predetermined pattern including the composition(s) and/or nanomaterial(s) included in the grooves of the transfer surface, as the case may be, preferably becomes reversibly adhered to the applicator. The predetermined patterned is thereafter deposited onto the substrate by contacting the applicator thereto.

As discussed above, in certain embodiments, a predetermined pattern can be deposited onto the substrate by including elevated features, corresponding to the predetermined pattern, on all or a portion of the transfer surface. In which embodiments, the nanomaterial disposed on the elevated features of the transfer surface can be picked up with an applicator in the predetermined pattern and deposited onto the substrate by contacting the applicator thereto.

In the various aspects of the invention, nanomaterial disposed on the transfer surface can be selectively removed in a predetermined pattern to be deposited onto the substrate.

For example, in certain embodiments, the transfer surface can be smooth or unpatterned. In such embodiments, one or more nanomaterials and/or one or more compositions comprising nanomaterial can be applied to the smooth transfer surface and a featured applicator can be used to pick-up and deposit a pattern including the composition(s) or nanomaterial(s), in the arrangement of the applicator features onto the substrate. Alternatively, one or more nanomaterials and/or one or more compositions comprising nanomaterial can be applied to the smooth transfer surface and a smooth or featureless applicator can be used to pick-up and deposit an unpatterned layer including the composition(s) or nanomaterial(s) onto the substrate.

In certain embodiments, for example, the nanomaterial can be removed from the transfer surface in a predetermined pattern by a patterned applicator (e.g., stamp, roller, etc.) with features (elevations and/or depressions) on the applicator surface corresponding to the predetermined pattern. In certain embodiments, a first pattern comprising nanomaterial can be removed by a first applicator and the subtractive pattern comprising nanomaterial disposed on the transfer surface can be picked up by a second applicator and deposited onto the substrate.

In another aspect, a featureless applicator can deposit an unpatterned layer comprising one or more nanomaterials from a smooth transfer surface.

In certain other embodiments including an unpatterned transfer surface, a featureless applicator can be used to deposit a pattern comprising one or more compositions or nanomaterials formed on the unpatterned transfer surface by, e.g., inkjet printing, silk-screening, other screen-printing technique, or other known technique for creating a pattern comprising one or more compositions or nanomaterials on the smooth transfer surface. A pattern formed on a transfer surface in such manner corresponds to the predetermined pattern including one or more nanomaterials to be deposited onto the substrate.

In another aspect of the invention, for example, a predetermined pattern can be formed on a transfer surface with use of a mask including one or more apertures. The number, size, shape, and arrangement of the apertures will be selected based on the predetermined pattern that is desired.

In certain embodiments, an example of which is depicted in FIG. 2 A, for example, a mask 202 including one or more apertures corresponding to the predetermined pattern can be placed on the transfer surface before the nanomaterial and/or composition is to be picked up by the applicator 201. In such case, the applicator surface, preferably unfeatured, can pick up the nanomaterial and/or composition including nanomaterial 203 from the transfer surface through the apertures arranged in a predetermined pattern to form patterned nanomaterial and/or composition thereon. The applicator including the patterned nanomaterial and/or composition can thereafter be contacted to the substrate 204 to deposit the pattern thereon. The nanomaterial and/or composition is preferably introduced to the transfer surface prior to positioning the mask thereon. In certain embodiments, any liquid is preferably removed from the nanomaterial and/or composition prior to positioning of the mask on the transfer surface to permit pick up of dry nanomaterial and/or composition through the mask and deposition thereof onto the substrate. (Mask geometry and stamp deformation determine the feature size.)

In certain other embodiments (not shown), nanomaterial and/or a composition including nanomaterial is deposited onto the transfer surface through a mask including one or more apertures arranged in the predetermined pattern. After the mask is removed, the patterned nanomaterial deposited onto transfer surface through the apertures can be picked up by an applicator, preferably with an unfeatured surface. The nanomaterial can thereafter be deposited onto the substrate from the applicator surface.

In certain preferred embodiments, an example of which is depicted in FIG. 2 B, a predetermined pattern can be formed on a substrate by positioning a mask 202 including one or more apertures arranged in a desired predetermined pattern on the substrate prior to contacting the applicator 201 to the substrate. By contacting the applicator including the nanomaterial and/or composition 203 to be applied to the substrate 204 through the mask apertures (the mask remaining in close contact with the substrate), a pattern of the nanomaterial and/or composition is applied to the substrate. In the example of the embodiment shown in FIG. 2B, mask openings enable definition of the pattern; and geometry of the mask and elastic properties of the applicator determine the feature size. In certain embodiments, the nanomaterial and/or composition on the applicator is preferably dry (e.g., at least substantially free of liquid) prior contacting the applicator to the substrate through the mask apertures. In certain embodiments, nanomaterial may be deposited through less than all of the apertures. In certain embodiments, the nanomaterial and/or composition on the applicator preferably comprises an unpatterned layer. In certain embodiments involving printing of nanomaterial (preferably semiconductor nanocrystals) and/or compositions including nanomaterials (preferably semiconductor nanocrystals) in hybrid inorganic-organic devices, the deposition (also referred to herein as printing) step(s) are preferably carried out in a nitrogen or vacuum environment.

In an example of a preferred embodiment of the method partially described in FIG. 2B, a nanomaterial and/or composition including nanomaterial is applied to an applicator. Preferably the applicator is dried to remove substantially all, and more preferably all, of any liquid included in the nanomaterial and/or composition thereon. A mask including a predetermined pattern of apertures of a desired size and shape is inserted between the substrate and the applicator and aligned to the substrate. The applicator including the dried nanomaterial and/or composition is brought into contact with the substrate through the apertures at a predetermined pressure following which the applicator is released from the substrate (e.g., by releasing the pressure, translating the substrate, etc.). In embodiments including deposition of one or more additional nanomaterials and/or compositions to the same substrate, the substrate can optionally be translated to a next location for a subsequent deposition step or alternatively, for example, the first mask can be cleaned and repositioned over the substrate for re-use or a different mask can be positioned over and aligned to the substrate and the next nanomaterial and/or composition deposited.

The foregoing process is particularly useful for depositing semiconductor nanocrystal emissive materials in a process for making various electro-optical devices including but not limited to electroluminescent light-emitting devices and displays.

In certain embodiments, a mask can be fabricated from a class of films comprising polyimides including fluorinated polyimide films or film coated, at least on one side, with a fluorinated material. In certain embodiment, a film coated, on at least one side, with a coating comprising an aromatic material. In certain embodiments, one side of the film can be coated with a fluorinated material and the other side can be coated with an aromatic material.

In certain embodiments in which a side of the mask is positioned on the substrate, it is preferred to use a fluorinated polyimide film or film coated, at least on one side, with a fluorinated material, with the side of the film including the fluorinated material being positioned against the substrate.

In certain embodiment, if a mask comprises plastic and/or a plastic coating, it is preferably baked out at elevated temperature with vacuum to remove VOCs, etc. prior to printing.

Masks of different thickness can be used. By way of non-limiting example, a mask comprising a polyimide film having a thickness of 1 mil polyimide can be used. Thinner and/or thicker masks are also suitable. Masks thinner than 0.5 mil are desirable for printing higher resolution patterns. Masks with a thickness less than 0.5 mil may require tensioning. Alternatively, the rigidity and/or dimensional stability of masks with a thickness less than 0.5 mil can be enforce with a thin steel foil. In certain other embodiments, a mask can comprise a rigid foil which optionally can be coated on one or both sides with a soft coating (e.g, Teflon).

A mask can be patterned with a predetermined pattern by known techniques (including, but not limited to, photo-etching and laser patterning) or unpatterned.

Examples of film materials from which a mask can be made include, without limitation, polyimide films such as, for example, and without limitation, 6FDA-ODA Fluorinated Polyimide, 6FDA-PMDA Fluorinated Co-Polyimide, 6FXDA-6FDA Fluorinated Polyimide Foam, Amoco Ultradel 4212 HFDA-APBP Polyimide, Au/Cr/Polyimide Composite, BPDA-ODA Polyimide, BPDA-PDA Polyimide Film, BPDA-PFMB Polyimide, BTDA-APB Polyimide, BTDA-ODA Polyimide, BTDA-PDA Polyimide, Ciba-Geigy Probimide 348 PMDA-ODA Polyimide, Ciba-Geigy Probimide 412 PSPI, Ciba-Geigy Probimide 414 PSPI, Ciba-Geigy XU-287 Soluble Polyimide, Cu/Cr/BPDA-PDA Polyimide Composite, Cu/Cr/PMDA-ODA Polyimide Composite, DuPont 5810D BPDA-PDA Polyimide, DuPont 5879HP PMDA-ODA Polyimide, DuPont FPI-136M Fluorinated Polyimide, DuPont FPI-45M Fluorinated Polyimide, DuPont Kapton 100 HN Polyimide Film, DuPont Kapton 300H Polyimide Film, DuPont Kapton 500HN Polyimide Film, DuPont Kapton Type H Polyimide Film, DuPont Kapton Type HN Polyimide Film, DuPont PI-2540 PMDA-4,4'-ODA Polyimide, DuPont PI-2545 PMDA-ODA Polyimide, DuPont PI-2556 BTDA-ODA-MPD Polyimide, DuPont PI-2560 BTDA-MPD-ODA Polyimide, DuPont PI-5878 PMDA-ODA Polyimide, DuPont Pyralin PI-2611 BPDA-PDA Polyimide, DuPont Pyralux Polyimide, GE Ultem Polyetherimide, Hitachi PIQ L100 Polyimide, Hitachi PIX L 110 Polyimide, Mitsui Toatsu Aurum 450C Thermoplastic Polyimide, OMM Probimide 112A, OMM Probimide 114A, OMM Probimide 115A, OMM Probimide 116A, OMM Probimide 7005, OMM Probimide 7010, OMM Probimide 7020, OMM Probimide 7505 PSPI, OMM Probimide 7510 PSPI, OMM Probimide 7520 PSPI, PMDA-3,4'-ODA Polyimide, PMDA-3FDA Fluorinated Polyimide, PMDA-3FDA Fluorinated Polyimide Foam, PMDA-ODA Polyimide, PMDA-ODA m-diethylester, PMDA-PDA Polyimide Film, Probimide 32 Polyamide-imide, SE45 Siloxane-Polyimide, Upilex R Polyimide Film, and Upilex S Polyimide Film.

A non-limiting example of a preferred mask comprises 001"±0.00015" THICK KAPTON HN includes slots with predetermined dimensions. For example, one embodiment of predetermined dimensions that can be used for printing a Red-Blue-Green subpixel arrangement for a display, can include line apertures or slots are 400 or 450 microns wide on a 1500 micron pitch.

Optionally, a mask can further include a hole in each of the four corners to mount and tension a mask to a rigid frame, which is preferred with thin masks, as discussed above. Various known techniques can be used to align a series of masks to be used to print and register multiple nanomaterials on a single substrate.

In certain embodiments, the mask can be placed against the transfer surface or substrate without gaps in between the transfer surface or substrate, as the case may be, and the underside of the mask.

One or more nanomaterials or compositions can be transferred from the transfer surface to an applicator by, for example, contacting (e.g., pressing) the applicator against the transfer surface including the one or more compositions or nanomaterials to be deposited.

The one or more compositions or nanomaterials transferred to the applicator surface from the transfer surface preferably become reversibly adhered to the applicator surface for later deposition onto the substrate.

As discussed above, in certain embodiments, the one or more compositions can thereafter be deposited from the applicator onto the substrate. If a wet transfer of composition (s) onto the substrate is desired, the time between patterning the applicator and depositing the pattern onto the substrate is minimized to allow the pattern to transfer while the patterned nanomaterial still includes at least an amount of the liquid.

As also discussed above, in certain other embodiments, the liquid can be removed from composition(s) by, for example, evaporation, before the remainder of the composition (e.g., nanomaterial and any other optional components) is deposited on the substrate.

Certain other embodiments include a dual dry transfer. A dual dry transfer includes a liquid-free or substantially liquid-free transfer of one or more nanomaterials from the transfer surface to the applicator and a liquid-free or substantially liquid-free transfer or the one or more nanomaterials from the applicator onto the substrate. A substantially liquid-free transfer includes, for example, no more than about 10 parts per hundred liquid, preferably no more than about 10 parts per thousand liquid, and more preferably no more than about 10 parts per million liquid.

For example, when one or more nanomaterials are introduced to a transfer surface as a component of a composition that also includes liquid, one or more nanomaterials can be transferred from the transfer surface to an applicator by, for example, contacting the applicator against the transfer surface after the liquid is removed from the composition. The liquid can be removed, for example, by evaporation at ambient conditions, by application or heat to accelerate evaporation, by adjusting the pressure to accelerate evaporation, by modifying the temperature and pressure to accelerate evaporation, etc.

The one or more nanomaterials transferred to the applicator surface from the transfer surface preferably become reversibly adhered to the applicator upon contacting the applicator to the transfer surface. The one or more nanomaterials can thereafter be deposited from the applicator onto the substrate.

As discussed above, a dry transfer process of one or more materials from the applicator onto the substrate can be advantageous when the liquid of the composition(s) including the nanomaterial(s) can dissolve or otherwise react with the surface of the substrate. Employing a dry transfer of nanomaterial(s) from the applicator onto the substrate frees the substrate of solubility and surface chemistry requirements.

A dual dry transfer can also be used to deposit unpatterned layers comprising nanomaterial.

Methods in accordance with the invention can be used to deposit a pattern comprising two or more different nanomaterials onto a substrate. The two or more different nanomaterials can be deposited sequentially or in a single step.

For example, each of the two or more different compositions or nanomaterials can be deposited in sequential separate depositions steps. This embodiment can be used, for example, when depositing a pattern comprising different color compositions or nanomaterials, and each color is deposited onto the substrate separately.

Preferably, each transfer is aligned and registered so that the predetermined pattern is deposited onto the substrate at a predefined location.

The method is compatible with various well-known alignment and registration techniques for example, when more than one pattern is deposited onto the substrate in more than one transfer. Factors that can affect the registration of subsequent printing steps onto a single substrate include multiple well pattern (e.g., groove) offset, as well as the travel distance from one nanomaterial deposition to the next. Since both of these parameters can be tuned on the micron scale, high repeatability after tuning is expected.

In certain embodiments, two or more different compositions or nanomaterials are deposited by a single transfer step. This can be achieved with use of a transfer surface which includes the two or more different compositions or nanomaterials on the surface thereof. For example, the two or more nanomaterials can be included in the grooves of a single transfer surface for simultaneous transfer. Alternatively, the two or more nanomaterials can by patterned on an smooth transfer surface by, e.g., inkjet or silk-screen printing, other screen-printing technique, vapor deposition (e.g., including masks to form a pattern comprising nanomaterials). In a further embodiment, each composition or nanomaterial can be applied to a single applicator one at a time in separate application steps to provide the predetermined arrangement of nanomaterial thereon.

When two or more nanomaterials, or two or more compositions, are transferred in the desired arrangement from a transfer surface by a single transfer step, the lateral offset of the patterns of the different nanomaterials, or compositions, can be better-controlled than when each of the different nanomaterials or compositions are transferred separately. This can reduce or preferably eliminate variation from printing to printing. Expected registration accuracy and repeatability can be better than 100 µm, as good as 1 µm, and eventually as good as 10 nm with precise mechanical systems.

For example, the transfer surface can include a predetermined arrangement of different compositions that include semiconductor nanocrystals that emit light at different wavelengths. By including such arrangement of semiconductor nanocrystals that emit light at different wavelengths, a multicolor pattern can be formed on the applicator for deposition onto the substrate.

Embodiments of the invention can also optionally include transferring more than one layer simultaneously, for example a blanket deposited (unpatterned) layer of a first material (e.g., metal, metal oxide, etc.) can be applied to an applicator and a patterned second material (e.g., semiconductor nanocrystals, etc.) applied thereto. Upon contacting the applicator to the substrate, the patterned second material is transferred as well as the blanket of first material.

The method of the invention can optionally utilize various machinery and equipment of the pad printing industry. Such machinery and equipment can optionally be manually operated, automated or semi-automated. An example of one manufacturer of such machinery and equipment is TOSH. Examples of TOSH machines suitable for the present method include Logica 150, Logica mi-microS, etc. However, other TOSH machines and equipment and machinery and equipment of other manufacturers may also be suitable. For further information concerning machinery and equipment, see, for example, John Kaverman, "Pad Printing Technical Guidebook," Second Edition (2002) Innovative Marking Systems, Inc. and Universal Pad Printing Guide (Machines Pads Inks Plates Tech Guide); Innovative Marking Systems; and www.padprinters.com, the disclosures of which are hereby incorporated herein by reference in their entireties.

Depending upon the nature of the nanomaterial and/or composition comprising nanomaterial being used, the nature of the substrate, and/or the end-uses for an article or device including the deposited composition or nanomaterial, it may also be desirable to carry out the method in a controlled environment, e.g., in a hood, glove box, under an inert atmosphere, under nitrogen, etc.

In certain embodiments, the transfer surface can be treated (e.g., by application of one or more coatings) or otherwise surface modified (e.g., chemical modification of the surface, energetic treatments (including, but not limited to, plasma treatment, laser treatment, etc.), or other suitable surface-modification techniques). A surface treatment can be applied to all or one or more portions of the surface. A surface treatment of the transfer surface can be included whether the surface is featureless or whether the surface includes features (e.g., one or more grooves). A surface treatment can include different treatments to different areas of the transfer surface. For example, the grooves (e.g., the side walls and trough of the grooves) can receive one type of surface treatment, and the top transfer surface (between the grooves) can receive a different type of surface treatment. The treatments can be applied, for example, to alter the properties (e.g., wetting attributes) of the transfer surface or portions thereof. For example, depending upon the wetting attributes of the composition and the wetting attributes of the non-grooved surface of the transfer surface and/or the surface of the grooves, it may be desirable to alter the surface energy of the non-grooved transfer surface and/or the surface energy of one or more of the grooves. Such surface energy modifications can be made, for example, by including a coating on the surface of the grooves of the transfer surface, on the non-grooved portion of the transfer surface, or both. Optionally, a first coating is applied to the surface of the grooves and a second coating is applied to the rest of the transfer surface, each coating material having either hydrophilic or hydrophobic properties, selected to reduce spreading.

Examples of various surface treatments that can be applied to the transfer surface include trichlorosilanes, other silylation treatments, teflon, etc. Selection of other surface treatments can be readily made by those of ordinary skill in the relevant art. In certain embodiments, silanized transfer surfaces can be preferred.

In certain embodiments, the surface energy of the groove surface can be modified to enhance wettability of the groove surface so that the composition dispensed in the groove spreads within the groove.

Preferably, the surface energy of the non-grooved surface of the transfer surface is modified to decrease the wettability so that the spreading of the composition on the non-grooved transfer surface is reduced, and preferably prevented. Modification of the non-grooved transfer surface can reduce the transfer of pattern defects that can result from the spread or other occurrence(s) of composition or nanomaterial on the non-grooved transfer surface at or prior to transfer of the composition from the groove(s) to the applicator. Modification of the grooves can facilitate the spread of the composition within the entire groove to assist pick-up of the full groove shape and size.

Methods in accordance with certain aspects of the invention include use of an applicator. In certain embodiments, the applicator can have a surface that is featureless or smooth (e.g. without patterned depressions and/or elevations). A featureless applicator surface can be planar or contoured (e.g., convex, pyramidal, conical, etc.). In certain embodiments, the applicator surface can include features formed by elevations and/or depressions on the surface, e.g., a pattern of elevations and/or depressions. The featured applicator surface can further be planar or contoured (e.g., convex, pyramidal, conical, etc.). Optionally, the surfaces of the individual features on the applicator can be planar or contoured. An applicator can further include a combination of one or more features with planar surface and one or more features with contoured surface.

A contoured applicator can be useful for providing higher fidelity printing and reduction of trapped gas (i.e. air, nitrogen) bubbles between the substrate and the applicator during the deposition of the patterned nanomaterial.

Examples of an applicator can include, without limitation, a surface of a stamp, a roller, a transfer tape, etc. Preferably, the applicator has a predetermined dimension so that a pattern can be formed by one time transfer, even, for example, in case of a display device having a large area by using an applicator corresponding to a selected area of the display device.

The applicator preferably has a configuration and dimensions selected for picking up the pattern formed from the filled transfer surface grooves.

The applicator can be configured to move or be moved relative to the position of other components of the printing system being used, e.g., the transfer surface and/or the uppermost surface of the substrate on which a nanomaterial or composition is to be applied. For example, the applicator can be mounted on a drum, the drum being configured to rotate. The surface of the applicator can be configured to roll on the substrate. The surface of the applicator includes an elevation or a depression, or the applicator can be substantially free of elevations and/or depressions. The surface of the applicator can be configured to be in continuous contact with the substrate.

In certain embodiments, the applicator can be a stamp.

The surface of the stamp can be planar or contoured (e.g., convex, angled, etc).

The surface of the stamp can be patterned (e.g., featured). A featured stamp can be used, for example, with a smooth transfer surface which includes nanomaterial, A featured stamp can be used, for example, with a transfer surface including grooves (in which case, the raised features of the stamp preferably correspond (e.g., in size, shape, and arrangement) to the depressions of the transfer surface for efficient inking of the elevated stamp features).

The surface of the stamp can be smooth or featureless (e.g., an absence of elevations and/or depressions of a pattern).

In embodiments in which the pattern to be applied onto the substrate is contained on the transfer surface itself, the selection of the materials and design (e.g., material, hardness, contour) of an applicator can be less restricted than when a patterned applicator is used to deposit a pattern onto the substrate.

Mechanical limitations for a patterned-stamp are reduced or overcome when a pattern is formed on a featureless stamp. When a textured stamp contacts a substrate, any applied pressure (at least adequate to achieve material transfer) is distributed in predictable but non-uniform ways. This induced stress can cause sagging of the stamp in the areas not in contact with the substrate surface. If the applied pressure is great enough, the sagging areas can contact the substrate surface, resulting in material transfer in undesired regions. In contrast, pressure applied to a stamp that is substantially free of elevations and/or depressions leads to uniformly distributed forces over the stamped area, and thus sagging and other non-uniform processes can be reduced or eliminated.

The stamp can be rigid or compressible.

The stamp can be constructed from a material which is elastomeric. For example, the stamp material comprises poly dimethyl siloxane (PDMS, for example Sylgard 184), other silicone elastomers; and other elastomers. In certain embodiments, a material with low creep characteristics is preferred.

A stamp comprising an elastomer material is particularly advantageous for depositing nanomaterial comprising, e.g., semiconductor nanocrystals, to a surface. The range of properties of various elastomer materials facilitates selection of an applicator having a predetermined hardness (durometer) which affects the force that can be applied as well as the compression of the stamp.

A stamp can be prepared, for example, by preparing a silicon master using standard semiconductor processing techniques which define a pattern on the silicon surface, for example a pattern of elevations and/or depressions. Poly dimethyl siloxane (PDMS, for example Sylgard 184) precursors are then mixed, degassed, poured onto the master, and degassed again, and allowed to cure at room temperature (or above room temperature, for faster cure times). The PDMS stamp, having a surface including the pattern of the silicon master, is then freed from the master, and cut into the desired shape and size.

Alternatively, for a non-patterned deposition, a stamp with a smooth planar or contoured surface can be used. For example, a blank elastomeric master can be prepared, for example, by molding to a smooth planar or contoured (e.g., curved) surface. Examples of smooth molding surface include, but are not limited to, optical glass lenses.

One can also utilize different elastomer molds to construct different stamp profiles, realizing higher or lower stress on the surface chemistry layer, depending on the application desired.

All of these mold shapes allow for the contact to be a single step or sequential steps. Preferably the entire applicator does not contact the substrate surface at once, but rather the highest point contacts initially, and then only with compression does the rest of the applicator make contact. This minimizes and more preferably prevents any air or gas bubbles from getting trapped between the applicator and the substrate. Trapped air and/or gas bubbles can cause areas where no transfer occurs, and hence a void or defect in the pattern that is applied to the substrate.

Alternatively, commercially available stamps can be used.

A preferred stamp is made from a material comprising a silicon based elastomer (e.g., without limitation, PDMS) doped with a fluorinated polymer. In certain embodiments, the fluorinated polymer is included in the material in an amount greater than zero up to at least about 0.1 weight percent. In certain embodiments, the fluorinated polymer can be included in an amount of at least about 0.001 weight percent. The amount of fluorinated polymer dopant can be included in the stamp material up to an amount that is less than the amount at which the silicon based elastomer including the fluorinated polymer dopant cannot be cured (e.g., forms an uncurable gel). In certain embodiments, the fluorinated polymer dopant comprises a fluoropolymer, a perfluorinated (completely fluorinated) polymer, a partially fluorinated polymer, a polymer with perfluorinated alkyl substituents, a polymer with perfluorinated aryl substituents, a polymer with partially fluorinated alkyl/aryl substituents, a polymer with perfluorinated branched alkyl/aryl substituents, a polymer with partially fluorinated branched alkyl/aryl substituents, or a mixture of any two or more of the foregoing. In certain other embodiments, the fluorinated polymer dopant comprises a fluoropolysiloxane, a perfluorinated (completely fluorinated) polysiloxane, a partially fluorinated polysiloxane, a polysiloxane with perfluorinated alkyl substituents, a polysiloxane with perfluorinated aryl substituents, a polysiloxane with partially fluorinated alkyl/aryl substituents, a polysiloxane with perfluorinated branched alkyl/aryl substituents, a polysiloxane with partially fluorinated branched alkyl/aryl substituents, or a mixture of any two or more of the foregoing. Examples of fluorinated polysiloxanes include, but are not limited to, Fluorogel™ Q3-6679 Dielectric Gel Part B and Fluorogel™ Q3-6679 Dielectric Gel Part A, both available from Dow Corning. In certain embodiments, the fluorinated polysiloxane is included in the stamp material in an amount from about 0.001 to about 50% by weight, from about 0.001 to about 10%, from about 0.5% by weight to about 5% by weight, from about 0.01 to 0.1% by weight. The stamping surface of a stamp prepared from a silicone based elastomer including a fluorinated polymer dopant preferably does not further include a surface chemistry layer or other surface treatment. The stamp can be prepared by known techniques. Preferably the fluorinated polymer dopant is included in the silicone based polymer prior to molding the stamp material.

Optionally, a surface chemistry layer can be disposed over the applicator. A surface chemistry layer can be applied by physical vapor deposition (PVD), chemical vapor deposition (CVD), or liquid or gas phase coating by a self-assembled monolayer, depending on the desired material surface properties.

The composition of the surface chemistry layer can be selected to readily adhere and release the composition, in a wet transfer, or nanomaterial, in a dry transfer. The surface chemistry layer can optionally act as a barrier to stamp swelling by the carrier medium for the nanomaterial of the composition, and an adhesion/surface chemistry layer for the composition or nanomaterial. Aromatic organic polymers, deposited by chemical vapor deposition, can be used as a surface chemistry layer. See, for example, S. Coe-Sullivan, et al., *Advanced Functional Materials,* 15, 1117-1124 (2005), which is incorporated by reference in its entirety. Application of the surface chemistry layer by chemical vapor deposition can result in a conformal coating of the shaped stamp. The surface chemistry layer can be chosen to compatible with spreading of the composition which includes nanomaterial and a liquid. For example, with a liquid comprising chloroform, the surface chemistry layer can be a chemical vapor deposited Parylene-C layer or other surface chemistry material. The Parylene-C layer can be, for example, 0.1 to 2 µm thick, depending on the pattern to be reproduced.

Including a surface chemistry layer on the surface of an applicator can advantageously enable complete release of the nanomaterial from the surface thereof. For example, a surface chemistry layer comprising Parylene-C is compatible with a wide range of liquids (e.g., non-polar organic liquids). Parylene-C is an aromatic polymer that can form thin and conformal coatings exhibiting highly inert properties.

The above properties of Parylene-C make it a suitable surface chemistry layer for use in depositing nanomaterials comprising semiconductor nanocrystals, particularly when deposited in thin layers including same. Optionally, a surface chemistry layer can include different parylene compositions or other surface chemistry materials (e.g., but not limited to, surface modifying organic molecules, plastics, and other surface chemistry treatments known or identifiable by a skilled artisan in the relevant art for achieving the desired surface properties). Other parylene materials that could be used in a surface chemistry layer include, for example, but are not limited to, Parylene, Parylene-N, Parylene-F, Parylene-D, Parylene-HT, Parylene AF4, etc. In certain embodiments, other surface treatments (e.g., energetic treatments including, but not limited to, plasma treatment, laser treatment, etc.) known or recognized in the art can be used.

In certain circumstances, a surface chemistry layer comprising Parylene-C may undergo as least partial delamination from PDMS. The can occur for example, due to temperature effects (in light of the differences between the thermal coefficients of the two materials) and/or upon repeated application of pressure. Such delamination problems can be reduced or avoided with use of surface chemistry release layer comprising organic molecular compounds. Such compounds can be included in a surface coating on an applicator. Preferably the surface coating has a surface energy less than about 50 $mJ/m^2$, more preferably less than about 30 $mJ/m^2$, and most preferably less than about 20 $mJ/m^2$. In certain embodiments, the organic molecular compounds can be aromatic molecular compounds. In other embodiments, the surface chemistry layer comprises xxx-silanes. Such materials include functional groups that can bond with functional groups at the elastomer surface and self-align themselves on the surface forming an organized coating. It is expected that these materials will remain immune to the dimensional changes in the elastomer originating from temperature variations or mechanical impact, and would maintain its de-wetting function over extended period of time. Examples of organic molecular compounds for inclusion in a surface chemistry release layer include, but are not limited to, aromatic organic molecular compounds.

Other examples of compounds for inclusion in a surface chemistry release layer include, but are not limited to, ethyltrichlorosilane, ethyltriethoxysilane, n-propyltrichlorosilane, n-propyltrimethoxysilane, n-butyltrichlorosilane, n-butyltrimethoxysilane, n-hexyltrichlorosilane, n-hexyltrimethoxysilane, n-octyltrichlorosilane, n-octyltriethoxysilane, n-decyltrichlorosilane, n-dodecyltrichlorosilane, n-dodecyltriethoxysilane, n-octadecyltrichlorosilane, n-octadecyltriethoxysilane, n-octadecyltrimethoxysilane, water soluble octadecylsilane, n-exosyltrichlorosilane, n-docosyltrichlorosilane, phenyltrichlorosilane, phenyltriethoxysilane, (tridecafluoro-1,1,2,2-tetrahydrooctyl)-1-trichlorosilane, and (tridecafluoro-1,1,2,2-tetrahydrooctyl)-1 triethoxysilane. In certain embodiments, the compounds can be hydrophobic.

In certain embodiments of methods in accordance with the invention, a preferred applicator comprises a coated stamp having a curved surface and a surface chemistry layer (e.g., Parylene-C or other surface treatment material) disposed thereon. For example, a curved Parylene-C coated stamp can deposit nanomaterial in a patterned or unpatterned layer with improved uniformity and consistency.

In certain embodiments, a curved Parylene-C coated stamp is useful to deposit semiconductor nanocrystals from a composition also including a non-polar liquid or liquid mixture, especially when used in conjunction with commercially available machines, e.g., pad printers, that provide controllable impact pressures.

The curvature of the stamp surface overcome the problems that can be encountered with flat surface applicators, e.g., trapped air bubbles, uncontrollable points of contact between stamp and substrate, and irreproducible or unknown pressure distributions of the stamp surface at impact. As discussed above, these problems can deposit films with unpredictable quality and unpredictable consistency in area coverage and printed film thickness.

A curved stamp provides a point of first contact with the substrate, as well as control over that point. As pressure is increased on the stamp, the moving edge of contact is consistent and well defined, traveling continuously away from the initial point of contact. In addition, a curved surface stamp allows air to be squeezed out, so that bubbles are not trapped between the stamp and substrate.

In certain embodiments, a stamp with a predetermined curvature can be created by molding the stamp material with an optical lens having a focal length selected to obtain the predetermined stamp curvature. Examples of focal lengths useful for preparing stamps including a convex-shaped surface useful for depositing nanomaterials include, but are not limited to, from about 10 mm to about 1,000 mm, from about 25 mm to about 500 mm, from about 100 mm to about 500 mm. In certain preferred embodiments, the focal length of the curvature is from about 15 mm to about 350 mm, and more preferably from about 25 mm to about 300 mm. In one embodiment, the diameter of the stamp surface is about 65 mm and the focal length is about 244 mm.

The diameter of the lenses can be selected based on the size of the area to which nanomaterial is to be deposited. The focal length can be selected taking into account the diameter of the lens and the size of the substrate. Preferably, the lens is concave. More preferably, the lens is an optical quality plano-concave lens. The focal length of the lens will be the negative value of the focal length desired for the curvature of the applicator surface. For example, an applicator with a convex surface and a focal length of 25 mm can be prepared from a plano-concave lens with a focal length of −25 mm. In certain embodiments, the diameter of the optical lens is, for example, at least 20% larger or, in other embodiments at least 30% larger, than the diameter or diagonal of the area to which nanomaterial is to be deposited.

This step is followed by the standard curing and coating procedures. Different curvatures allow for variability in pressure distributions at impact, speed of the moving contact line, inkability, and surface area of resulting film. Preferably, the mold used to form the curved surface of the stamp is optically smooth. The smoothness of the mold can improve the flatness of deposited layers of nanomaterials, e.g., semiconductor nanocrystals, at monolayer thicknesses. In certain embodiments, the Λ or smoothness rms of the stamp surface is less than about 5 nm.

Alternatively, the applicator can be the surface of a roller. In certain embodiments, the dimensions of the roller can be selected corresponding to the dimension of the substrate. For example, the roller can have a width that is substantially the same as that of a surface (e.g., a panel of a display device to be fabricated) and a circumference having the same length as that of the surface. In such example, the composition filled in the groove of the transfer surface can be transferred to a circumferential surface of the transfer roller and deposited onto the substrate by a one time rotation. In other embodiments, other size rollers can be selected. Depending on the sizes of the roller and substrate, deposition may include less than one or greater than one rotation of the roller across the substrate surface.

As the transfer roller is rotated in a state of being in contact with the surface the predetermined pattern comprising nanomaterial is formed on the substrate. At this time, depending upon the size of the roller and substrate, it is possible to form the predetermined pattern over the entire substrate of, for example, the display, by one rotation of the transfer roller.

For example, if the transfer surface and the transfer roller can be fabricated according to the size of the substrate deposition region, the pattern can be formed thereon by one transfer, thereby enabling formation of a pattern having a large area just by one event of processing.

This embodiment has many advantages. Particularly, the predetermined pattern comprising nanomaterial can be deposited onto the substrate having a large area by one-time processing and a pattern more complex than a pattern using conventional photolithography processing can be formed.

Figure 3A:
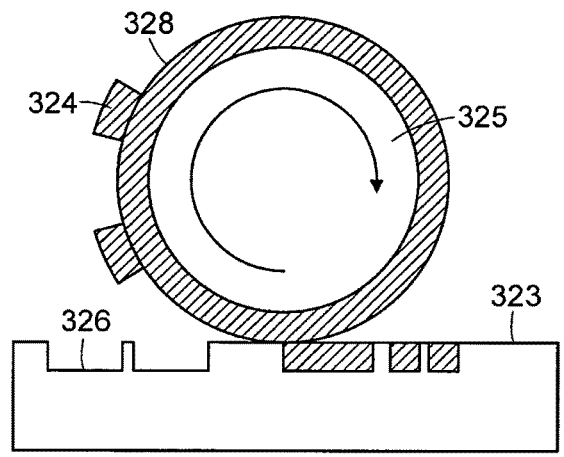
FIGS. 3 A-B are diagrams depicting an example of a method for depositing one or more compositions and/or nanomaterials onto a substrate.
Figure 3B:
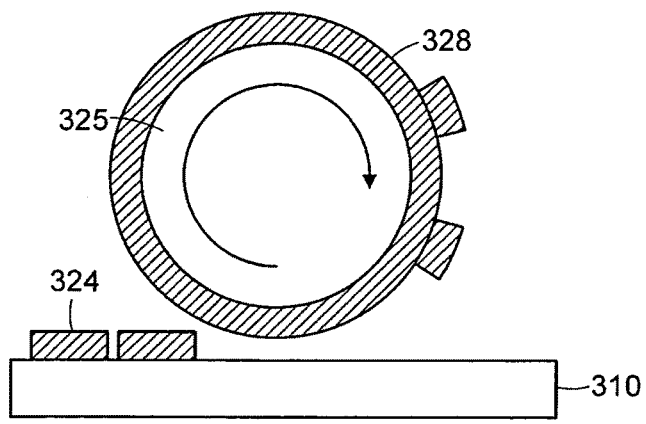

In FIG. 3 A, the applicator is, by way of example, a roller 325 that may be rolled across the uppermost surface 323 of the transfer surface along a first direction so that the one or more compositions contained in the plurality of grooves of the transfer surface are temporarily bonded onto the surface 328 of roller 325. Accordingly, the pattern comprising the composition-filled grooves 326 is transferred onto the applicator.

When transfer of the pattern features 324 onto the roller 325 is complete, the transfer surface may be refilled or cleaned and refilled.

In FIG. 3 B the roller 325 with the composition pattern 324 may be positioned above a substrate 310. The roller may roll across the substrate thereby transferring a pattern 324 of nanomaterial from the roller onto the substrate (e.g., the uppermost surface of a substrate which may optionally include one or more layers of a structure.) Accordingly, the pattern of the filled grooves 326 (in FIG. 3 A) is transferred onto the substrate. The substrate 310 including the pattern 324 of one or more nanomaterials may subsequently undergo additional processing.

If a dry transfer is desired, for example, after the predetermined pattern comprising the composition is applied to the applicator, the patterned composition is permitted to dry so that when the applicator is contacted to the substrate, patterned nanomaterial is transferred to the substrate.

Preferably the applicator is contacted to the surface of the substrate under conditions to cause at least a portion of the nanomaterial included on the applicator to be deposited onto the substrate For example, in certain embodiments, the applicator can be contacted to the substrate at a pressure of at least 0.1 lb/in$^2$ for at least a period of time effective for transferring at least a portion of the nanomaterial onto the substrate, e.g., thirty seconds or less. In certain embodiments, for example, the pressure is at least 1 lb/in$^2$, but less than 50 lb/in$^2$. In certain other embodiments, for example, the pressure is in the range from about 100 lb/in$^2$ to about 500 lb/in$^2$ In certain other embodiments the pressure is less than the pressure at which the film or substrate is damaged.

The surface details (e.g., featured or featureless), shape (e.g., planar or contoured, etc.), dimension, and hardness of the applicator are selected based upon the particular composition (e.g., the weight % nanomaterial in the composition, the liquid, any other optional components), the contemplated end-use application, the substrate, etc. These various aspects of the applicator surface can be readily selected and determined by a person of ordinary skill in the art.

One or more compositions including one or more nanomaterials can be delivered to a transfer surface by various techniques. For example, the composition(s) can be dispensed from an inkcup, a micro-dispenser (e.g., a needle, inkjet print head, nozzles, syringe, etc.), an array of micro-dispensers (e.g., an array of needles, an array of multiple inkjet heads, an array of nozzles, misters, and array or syringes, etc.) that are movably mounted to be positioned over and aligned with the location on the transfer surface to which one or more compositions are to be dispensed. Preferably, a predetermined metered amount of a composition is dispensed. Techniques for delivering or dispensing composition to a transfer surface will be discussed further below. Optionally, various masking techniques can be further included with techniques for delivering or dispensing a compositions selectively to a transfer surface.

For example, one or more compositions can be dispensed to one or more grooves of the transfer surface by various techniques, including, but not limited to, use of an inkcup or from a micro-dispenser or an array of micro-dispensers (e.g., needles, inkjet nozzles, misters, etc.) positioned over and aligned to dispense a metered amount of composition into each groove to be filled.

An inkcup technique can be particularly useful for dispensing the composition into transfer surface grooves. Any type of inkcup can be used, for example, an open inkcup, a closed inkcup, or a pressurized inkcup.

In an open inkcup, the content is confined in a well that is open to the atmosphere. Depending on the properties of the content, the content of an open inkcup can experience variations in concentration and viscosity caused by evaporation. Such variations can affect the quality of the pattern of nanomaterial that is deposited onto the substrate.

In a closed inkcup, the content is confined in a well that is closed to the atmosphere, so variations to the content that can result from evaporation are reduced or eliminated. For this and other reasons, a closed inkcup is preferred. A closed inkcup can be positioned upside down and slide over the transfer surface or the transfer surface may slide over the inking surface of the inkcup. The latter approach requires the inkcup to be pressurized. A pressurized inkcup typically includes a diaphragm that supports the ink well and can be raised to wet the transfer surface pattern and then retracted.

The pressurized ink cup can be particularly useful when printing has to be done on the surfaces that are not horizontally positioned relative to the inking surface of the inkcup.

With a closed inkcup system, the composition to be dispensed is confined within the ink-cup. The edge of the inkcup that is in contact with the transfer surface during the dispensing of the composition is sometimes referred to as a doctor ring. This edge in contact with the transfer surface forms a seal with the transfer surface. In certain embodiments, the seal can be improved by application of pressure. The seal between the inkcup edge and the transfer surface depends upon the flatness of these parts and also on surface finish of each. When an inkcup is used to dispense the composition, the area of the transfer surface containing the grooved pattern is preferably planar and preferably smooth.

The sealing force between the ink-cup and surface of the transfer surface is also dependent on the mass of the inkcup and any additional pressure applied to the inkcup when contacted to the transfer surface. Optionally, the seal between the inkcup and surface of the transfer surface can be further reinforced by, for example, a magnetic force originated by magnets located within the body of the ink-cup and under transfer surface that is magnetic, e.g., a steel plate.

Inkcups can be used with compositions of having viscosities, for example, from greater than about 1 cP to about 20 cP, less than about 1 cP, greater than about 20 cP, etc.

The edge of the inkcup that is in contact with the transfer surface acts as a doctor blade. When the inkcup is moved across the transfer surface, the composition is filled into the grooves over which the inkcup is moved, and the composition which remains at the surface of the transfer surface between the grooves is removed. The use of an inkcup allows for a high degree of flexibility and control over how to introduce the composition to the inkcup.

Manipulation of pressure (e.g., by vacuum (e.g., within the inkcup) or positive pressure) allows the control of leakage of low viscosity inks from the transfer surface/inkcup assembly, as well as control of concentration variations that could be associated with any such leakage.

When two or more different compositions are to be dispensed into certain transfer surface grooves, they are preferably dispensed from an inkcup one composition at a time.

Preferably, a tight seal is maintained between the portion of the inkcup (e.g., doctor ring) in contact with the transfer surface and the transfer surface itself to confine the composition within the cup. This can be particularly useful when the composition includes a carrier medium having a low viscosity liquid. More preferably, the portion of the inkcup in contact with the transfer surface comprises a substantially smooth, planar finish.

Optionally, the surface energy of the portion of the inkcup in contact with the transfer surface can be modified to increase the dewetting characteristics thereof with respect to the composition being dispensed by the inkcup. Such modification of the inkcup can assist in reducing the possibility of leakage of the composition through any surface imperfections at the seal between the inkcup and the transfer surface so that the composition preferably remains confined within the cup when moving across the transfer surface until deposited in the grooves of the transfer surface pattern.

The surface modification of the inkcup edge can optionally be utilized with one or more surface energy modifications of the transfer surface(s) discussed above. It is believed that any such surface modifications, alone or in combination, can extend the range of liquid viscosity to lower values, and improve uniformity of transferred patterns.

Most preferably, the mating seal counterparts, the doctor ring, and transfer surface are free of surface defects such as cracks, grooves, indentions, or even micro scale damage to prevent leakage of the composition.

The edge of the inkcup in contact with the transfer surface and/or the non-grooved surface of the transfer surface are optionally planarized and/or polished to reduce, and preferably, eliminate defects that can result in leakage of composition from the mated surfaces while the composition is being dispensed into the grooves.

Optionally, these two surfaces comprise materials with different hardnesses, such as, for example, a cliché comprising steel and an inkcup with an edge comprising a ceramic material that is softer than the steel used to fabricate the cliché. Various other materials of construction and/or their combinations, such as various ceramics, ceramic coating, glass, metals, or silicon may alternatively be utilized, for the transfer surface and inkcup edge.

An inkcup can be used in a static fashion, where the cup is filled, sealed, and not tampered with through successive prints. Alternatively, a flow system can optionally be utilized to reflow the composition from the inkcup to a reservoir, thereby maintaining and stabilizing the composition concentration and viscosity. The composition in a reflow loop may further optionally be monitored for concentration (via various optical means, for example) and the concentration maintained actively by addition of controlled quantities of carrier medium or concentrated composition or nanomaterial into the reflow loop to lower or raise the concentration of nanomaterial in the composition.

Another technique that is particularly useful for dispensing one or more compositions (e.g., different colored compositions) onto a transfer surface includes use of a micro-dispenser or an array of micro-dispensers (e.g., needles, inkjet nozzles, etc.) positioned over and aligned to dispense such composition or compositions thereto. In certain embodiments, the transfer surface includes one or more depressions (e.g., grooves, recessed wells, etc.), in which case, the micro-dispenser or array of micro-dispenses can be aligned to deliver the composition(s) into the individual grooves. Such micro-dispensers can optionally deliver different compositions to the transfer surface simultaneously or sequentially.

When the composition is dispensed from one or more micro-dispensers to grooves of a transfer surface, the transfer surface grooves can be filled by moving the transfer surface relative to the micro-dispenser(s) or alternatively, the micro-dispenser(s) can be moved relative to the grooves of the transfer surface, with the moving component being stopped at intervals selected to permit filling of unfilled grooves until all of the grooves are filled.

A micro-dispenser can be used to fill each of the grooves with the same composition. Two or more different compositions can be dispensed into the transfer surface grooves by sequential delivery of each composition from a micro-dispenser. Two or more different compositions can be dispensed into the transfer surface grooves non-sequentially. For example, an array of multiple micro-dispensers, e.g., an ink jet system having multiple print heads, can dispense different nanomaterials in a non-sequential manner. An array of micro-dispensers can also be programmed to dispense compositions into the grooves sequentially or in accordance with another predetermined order based on the pattern, groove location, dimensions of the transfer surface, etc.

Figure 4:
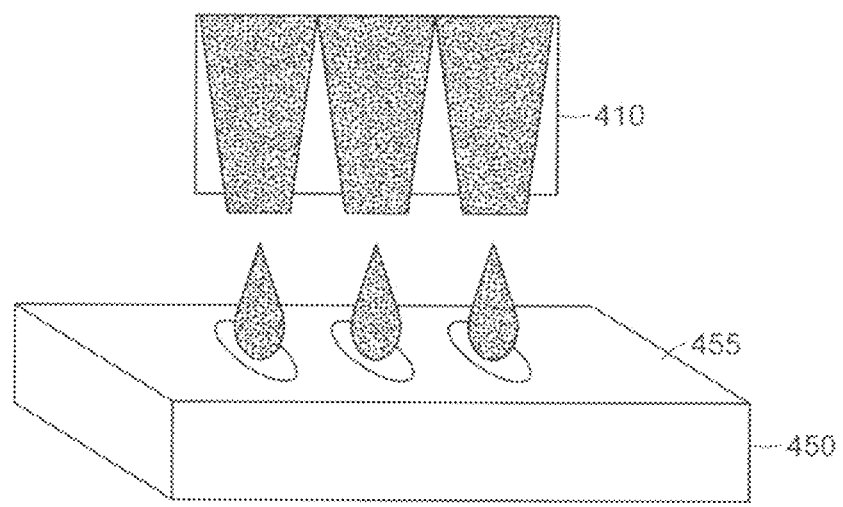
FIG. 4 is a diagram depicting an example of a technique for dispensing one or more compositions to a transfer surface.

FIG. 4 depicts a schematic of an example of a system including an array of micro-dispensers for dispensing one or more compositions into grooves of a cliché. The cliché 450 includes a predetermined pattern of grooves in the upper surface 455 thereof. An array micro-dispensers 410 is disposed over the cliché to dispense compositions into the grooves. At dispensing time, each micro-dispenser is aligned with the groove into which a given composition is to be dispensed.

Figure 5:
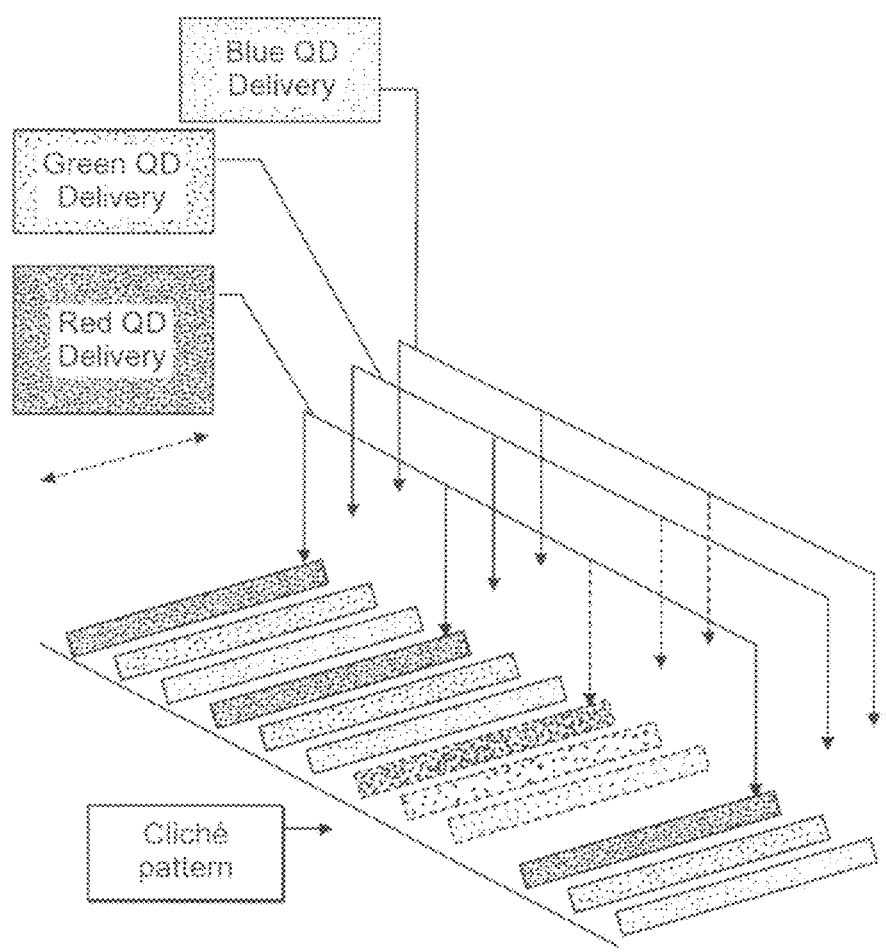
FIG. 5 illustrates an example of a technique for dispensing one or more compositions to a transfer surface.
Figure 6A:
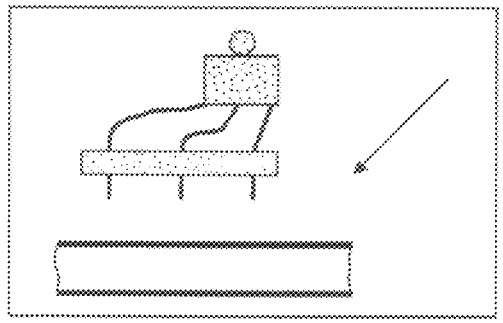
FIGS. 6 A-D illustrate diagrams depicting an example of a method for depositing one or more compositions and/or nanomaterials onto a substrate.
Figure 6B:
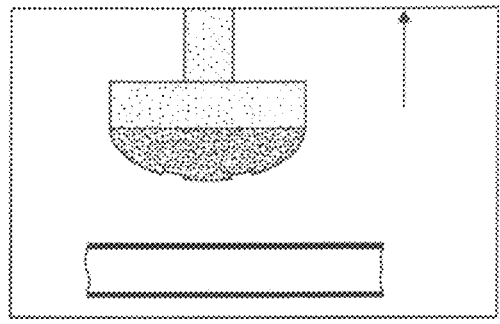
Figure 6C:
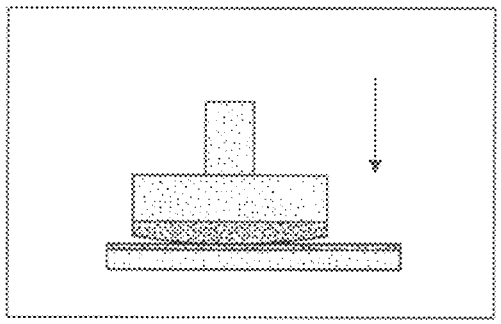
Figure 6D:
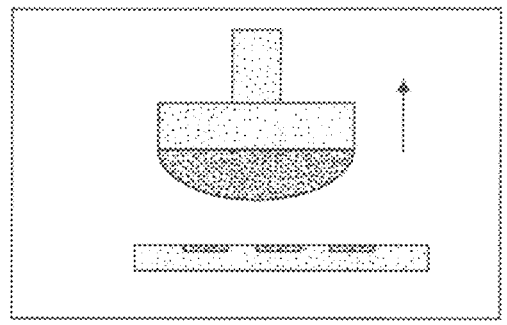

FIG. 5 depicts a schematic of example of a system for dispensing more than one composition into grooves of a cliché. The system includes an array of micro-dispensers that are spatially arranged for dispensing compositions into the predetermined pattern formed by the array of grooves on the transfer surface. Optionally, micro-dispensers can be positioned along a dimension (e.g., length, width, diagonal, etc.) of the cliché. Optionally, the individual micro-dispensers of an array can be arranged in a linear arrangement, but the arrays are positioned above the transfer surface at an angle to allow dispensing compositions into closely spaced grooves. Alternatively, a linear array of microdispensers are positioned above transfer surfaces that are disposed on an angle. Other configurations of the transfer surface grooves and the array of micro-dispensers are possible. The relative placement of the micro-dispensers corresponds to the pattern of the cliché so that when a composition is dispensed into a groove, the dispensed composition will spread in or wet a groove of the cliché due to surface tension and gravity. Subsequent to filling a groove, the micro-dispenser can be moved to be positioned over the next groove to receive the same composition. The micro-dispenser array will continue to move over the area of the pattern dispensing the composition in a continuous mode or by multiple injections. A second micro-dispenser array will similarly dispense a second composition into the appropriate grooves in accordance with the predetermined pattern.

After the grooves are filled with the one or more different compositions (e.g., three different compositions, each respectively comprising, e.g., blue-emitting, green-emitting, and red-emitting semiconductor nanocrystals (also referred to as quantum dots (abbreviated as "QD" in FIG. 5)), the predetermined pattern is picked-up by the applicator and the pattern can thereafter be applied to the substrate.

Preferably, one or more compositions or nanomaterials are deposited onto a substrate in a single deposition step. This single transfer process reduces and preferably eliminates variations in the concentrations of nanomaterial in the composition during the deposition of the pattern to the substrate.

This preferred embodiment method can include a featureless applicator or a featured applicator.

In an embodiment including an applicator with a featureless surface (e.g., a stamp or roller with a surface that is substantially free of elevations and/or depressions), the applicator surface can be patterned by contact with a cliché to transfer multiple compositions or nanomaterials to a substrate, rather than using a separate stamp for each different composition or nanomaterial.

In an embodiment including a featured applicator surface, the features of the applicator are aligned with a transfer surface which includes a pattern of grooves arranged and sized to receive the features of the patterned applicator. To apply a composition or nanomaterial to a stamp feature, the stamp features are contacted to compositions or nanomaterials included in corresponding grooves. The stamp features pick-up the predetermined composition(s) for application of the pattern to the substrate.

The use of a single deposition step to transfer a complete pattern or multiple components of a pattern avoids the need to register subsequent stamps to the previously deposited patterns. Further, by reducing the number of instances of contact between the applicator and the substrate to which nanomaterial has been previously applied, the possible damage to, or disruption of, the previously applied nanomaterial is reduced. For example, in depositing a pattern comprising different color nanomaterials comprising semiconductor nanocrystals to a substrate, a single step transfer reduces the risk of damage to the patterned nanomaterials. This can be particularly advantageous when the nanomaterials are applied in thicknesses of several monolayers or less.

FIGS. 6A-6D provide a schematic of an example of the steps involved in a single transfer of more than one different color nanomaterials. In Step A (FIG. 6A), more than one composition is dispensed into the grooves (not shown) in an upper surface of a transfer surface. In certain embodiments, multiple compositions can be dispensed from micro-dispensers disposed over the transfer surface in an array. Each of the micro-dispensers can dispense a composition at the same or different times. Optionally, the transfer surface can be moved under a positioned dispenser or micro-dispenser array, the dispenser or micro-dispenser can be moved over a positioned transfer surface, or the transfer surface and array can each be moved into alignment at or prior to the time the grooves are filled.

To transfer a pattern comprising different nanomaterials in a single transfer step, all of the various compositions including the different nanomaterials to be deposited are dispensed into the patterned grooves before the applicator is contacted to the transfer surface.

For example, an applicator is contacted to the transfer surface and separated therefrom to form a pattern on the surface of the applicator (Step B (FIG. 6B)).

If a dry transfer is desired, for example, the transfer surface is not contacted to the substrate until any liquid component of the composition(s) evaporates from the transfer surface, leaving liquid-free, or substantially liquid-free, nanomaterials on the transfer surface. As discussed above, a substantially liquid-free transfer includes, for example, no more than about 10 parts per hundred liquid, preferably no more than about 10 parts per thousand liquid, and more preferably no more than about 10 parts per million liquid.

The applicator surface including the pattern is contacted to the substrate to deposit the pattern thereon (Step C (FIG. 6C)) and thereafter separated therefrom (Step D (FIG. 6D)).

By depositing more than one nanomaterial onto the substrate in a single transfer, better control of the concentration of the composition can be possible. Additionally, cleaning steps between separate transfers of different nanomaterials can be avoided.

As discussed herein, the ability to transfer a pattern comprising more than one nanomaterial by a single transfer further avoids the need to register the alignment of successive transfers of separate transfers of each individual nanomaterial and eliminates the need to index successive transfers of each individual nanomaterial. Scale-up can also be facilitated.

Figure 7:
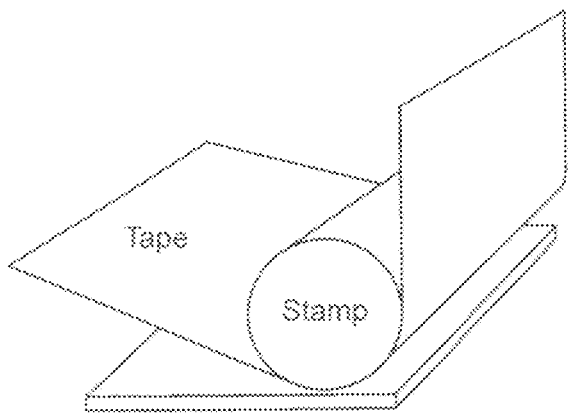
FIG. 7 is a diagram depicting an example of a method of the invention including a tape.

Another technique for depositing a pattern comprising nanomaterial onto a substrate includes the use of a tape. The tape can act as a donor surface for depositing nanomaterial onto a substrate or onto a temporary transfer surface. FIG. 7 depicts the relative arrangement of a tape and substrate to receive the deposited composition(s) or nanomaterial(s). In the example shown, the tape is contacted to the substrate with use of a presser (depicted in the illustrated example as a stamp). In the example shown in FIG. 7 the presser comprises a roller with a circular cross-section. Alternatively, a roller with an oval cross section, a stamp, or other device suitable for depressing the tape against the transfer surface and/or substrate may optionally be used.

Other techniques, methods and applications that may be useful with a tape including nanomaterial disposed thereon are described in U.S. Provisional Patent Application No. 60/790,393, entitled "Methods And Articles Including Nanomaterial", of Seth Coe-Sullivan, Maria J. Anc, LeeAnn Kim, Vladimir Bulovic, Ioannis Kymissis, John E. Ritter, and Robert Praino, filed by Express Mail on 7 Apr. 2006, the disclosure of which is hereby incorporated herein by reference in its entirety.

Figure 9:
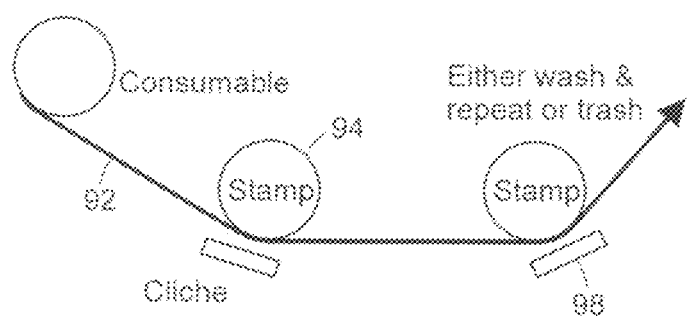
FIG. 9 is diagram depicting an example of a system for use in various embodiments of a method of the invention.
Figure 10A:
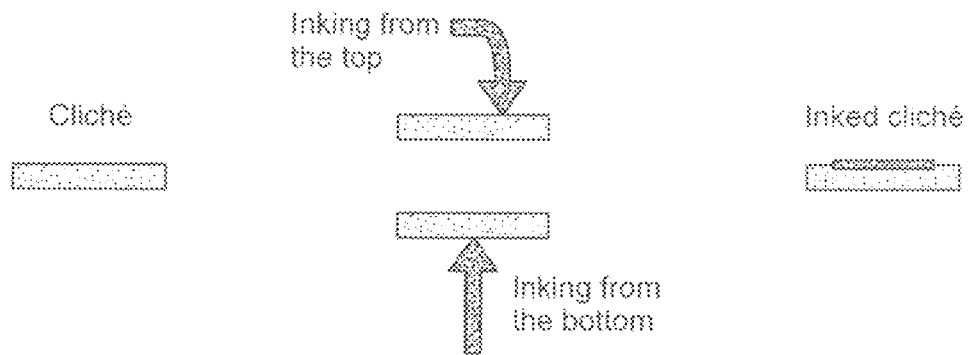
FIGS. 10 A-D are diagrams depicting an example of a system including a transfer surface and tape for use in various embodiments of a method of the invention.
Figure 10B:
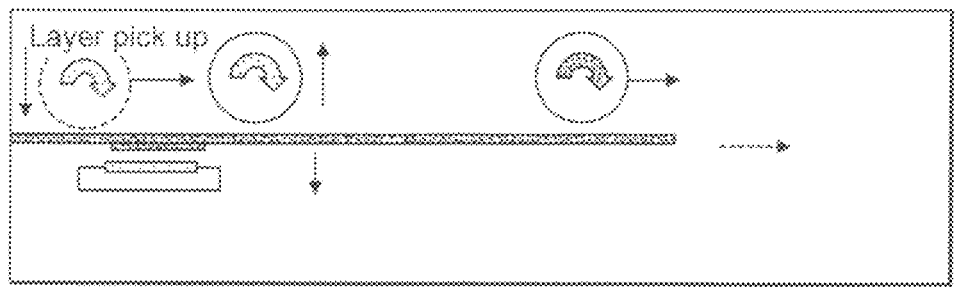
Figure 10C:
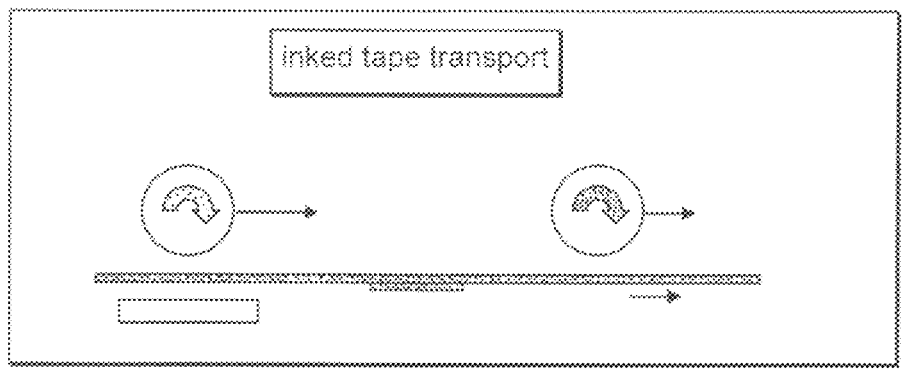
Figure 10D:
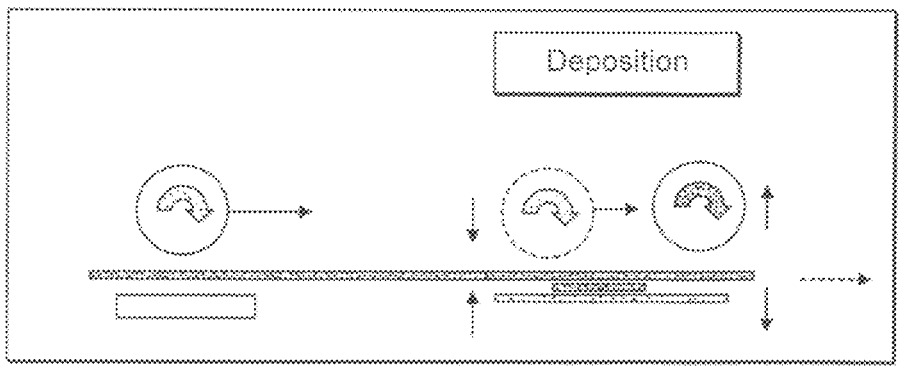

FIG. 9 provides a schematic example of a system including a tape for depositing nanomaterial onto a substrate.

Figure 8:
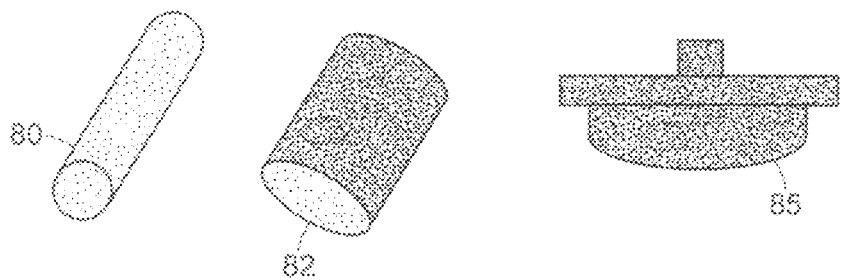
FIG. 8 are diagrams depicting examples of applicators for use in various embodiments of a method of the invention.

Referring to FIG. 9, the deposition of one or more nanomaterials onto a substrate is facilitated by pick up of a composition comprising nanomaterial, unpatterned or in a predetermined pattern, from a transfer surface (e.g., a cliché system as depicted) onto a surface of the tape 92 which is run through the system. The nanomaterial is subsequently transferred to the substrate 98. A presser 94 (examples of which include a roller (having e.g., circular or oval cross-section) or a stamp (examples of which are depicted in FIG. 8) or other suitable component may be used to press the tape against the transfer surface and/or to press the tape against the substrate. The presser and tape act as an applicator to deposit nanomaterial onto the substrate.

Optionally, the tape and presser can be selected to have dimensions selected such that the substrate can be fully patterned in a single process step.

The tape can optionally be a consumable or can be recycled. If recycled, the tape will preferable be clean before being reused. Optionally, this method can carried out in a continuous manner (e.g., roll to roll).

An embodiment of the invention including a tape can optionally further include a release layer or other surface treatment of the tape surface, tape dispensing components, post-use conditioning of the tape (dry or wet cleaning), etc.

In embodiments including deposition of a predetermined pattern comprising one or more different nanomaterials, the number, arrangement, shape, and size of the grooves of the transfer surface and the nanomaterials included therein will be selected according to the predetermined pattern to be deposited onto the substrate. The one or more compositions comprising the nanomaterials to be deposited can be dispensed into the grooves by any of the above-discussed techniques or other suitable techniques for dispense compositions and/or nanomaterials onto a transfer surface.

The use of a tape to deposit nanomaterial onto the substrate is expected to deposit nanomaterial(s) onto the substrate with improved resolution (e.g., fewer distortions in the applied pattern). A method utilizing a tape to deposit nanomaterial(s) onto the substrate is expected to provide increased scalability with respect to the sizes of the substrates to be patterned and also the number of surfaces to be processed per unit time.

Preferably the tape has sufficient thickness and/or rigidity to receive the composition, transfer the composition or nanomaterial, and be manipulated by the presser and tape handling components of the equipment. Examples of tape materials include, e.g., PET, Kapton, plastic, foil, paper, nylon, cloth, etc. The tape preferably has a release layer deposited on the face that will pick up the composition and deposit the composition and/or nanomaterial composition onto the substrate, depending on whether a wet or dry transfer is desired. Examples of a coating include, Parylene, Parylene-C, Parylene-N, Parylene-F, Parylene-D, Parylene-HT, Parylene AF4, other parylene compositions, other surface modifying organic molecules, and other plastics, and other surface chemistry and/or other surface treatments (e.g., energetic treatments including, but not limited to, plasma treatment, laser treatment, etc.) known or recognized in the art. In certain embodiments, the surface can be silanized.

If a coating or release layer is included on the tape, deterioration (e.g., abrasion-wear, flaking due to brittleness, etc.) of the integrity of the layer (e.g., the integrity of the attachment of the layer to the tape, smoothness of the layer, etc.) can be reduced by adjusting the shape and contour of the presser (e.g., the radius of curvature of a stamps, the radius of curvature of the rollers, the tape path itself, etc.).

In certain embodiments, the surface of the tape can be smooth (e.g., it does not include elevations and/or depressions). In other embodiments, the surface of the tape can include features (e.g., elevations and/or depressions).

As in the other embodiments discussed above, preferably a presser is not a flat surface that fully presses the tape against the substrate at a single time, to minimize trapped air between the tape and substrate when the composition or nanomaterial, as the case may be, is applied. Trapped air during the deposition step can result in an incomplete transfer.

Using a pick-up rate and deposition rate that are the same can result in ineffective transfer of the nanomaterial to the substrate in when a tape and presser comprising a roller are used. It is expected that a more effective transfer can occur when the two rates are different. See Matthew A. Meitl, et al., "Transfer Printing By Kinetic Control Of Adhesion To An Elastomeric Stamp", *Nature Materials* 5, 33-38 (1 Jan. 2006) Letters, the disclosure of which is hereby incorporated herein by reference in its entirety.

Referring to FIG. 10 A, one or more compositions are delivered to the uppermost surface of a transfer surface from above (by, e.g., an inkcup, a micro-dispenser, an array of micro-dispensers, etc.) or from below the transfer surface (by, e.g., use of a transfer surface with a reservoir below and in connection with the uppermost surface of the transfer surface).

Referring to FIG. 10 B, a tape is passed over the uppermost surface of a transfer surface including at least one composition. A first presser (depicted as a roller with a circular cross-section) rolls over the side of the tape remote from the transfer surface to press the underside of the tape (as depicted) against the uppermost surface of the transfer surface to transfer composition from the transfer surface to the tape. Referring to FIG. 10 C, the tape is advanced to align the composition on the tape for application to the substrate upon contact when pressed by a second presser (FIG. 10 D).

If a dry transfer is desired, for example, after the predetermined pattern comprising the composition is applied to the tape, the patterned composition can be permitted to dry so that when the second presser presses the tape including the pattern against the substrate, patterned nanomaterial is transferred to the substrate.

While both depicted as rollers, the first and second pressers can have the same or different shapes and/or sizes. It is envisioned that a single presser could be moved relative to the tape, transfer surface, and substrate instead of using two applicators. Optionally the surface of the applicator(s) used can be patterned or featureless.

Alternatively, an unpatterned layer of one or more nanomaterials can be transferred to a tape from a smooth transfer surface and deposited onto the substrate by contacting the tape to the substrate.

Figure 11:
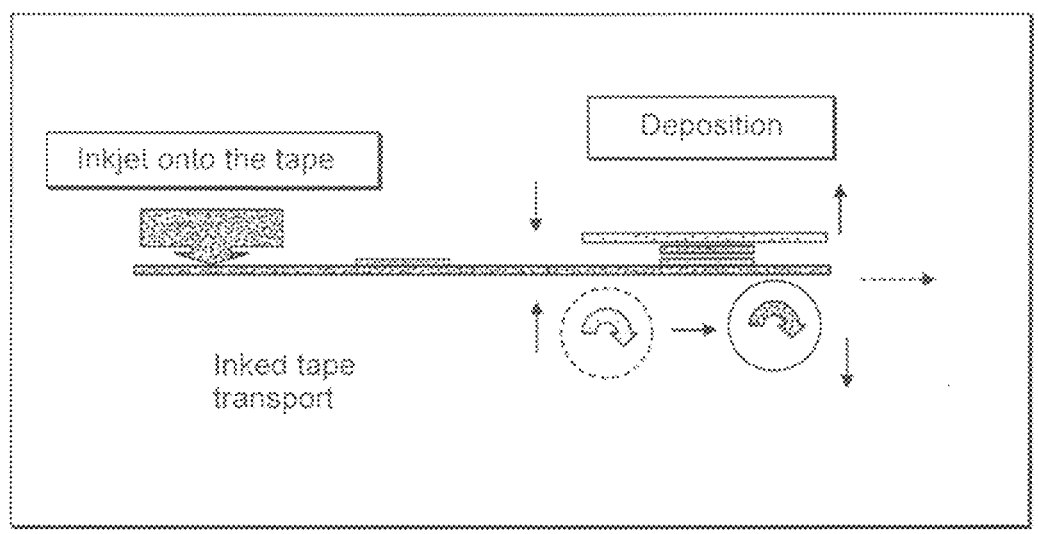
FIG. 11 is a diagram depicting an example of a system including a tape for use in various embodiments of a method of the invention.

FIG. 11 illustrates an alternative embodiment in which one or more compositions are delivered to a surface of the tape by inkjet printing. When a composition is used which includes a carrier which dissolves or otherwise reacts with the substrate, the use of inkjet printing to deliver the composition to the surface can reduce or remove the considerations of such reaction provided the vapor pressure of the carrier and/or ambient conditions facilitate evaporation of the carrier prior to transfer of the nanomaterial to the substrate.

While FIGS. 10 and 11 depict examples of embodiments that include a roller, a stamp or other device could alternatively be used to contact the tape to the transfer surface and/or the substrate.

Figure 12:
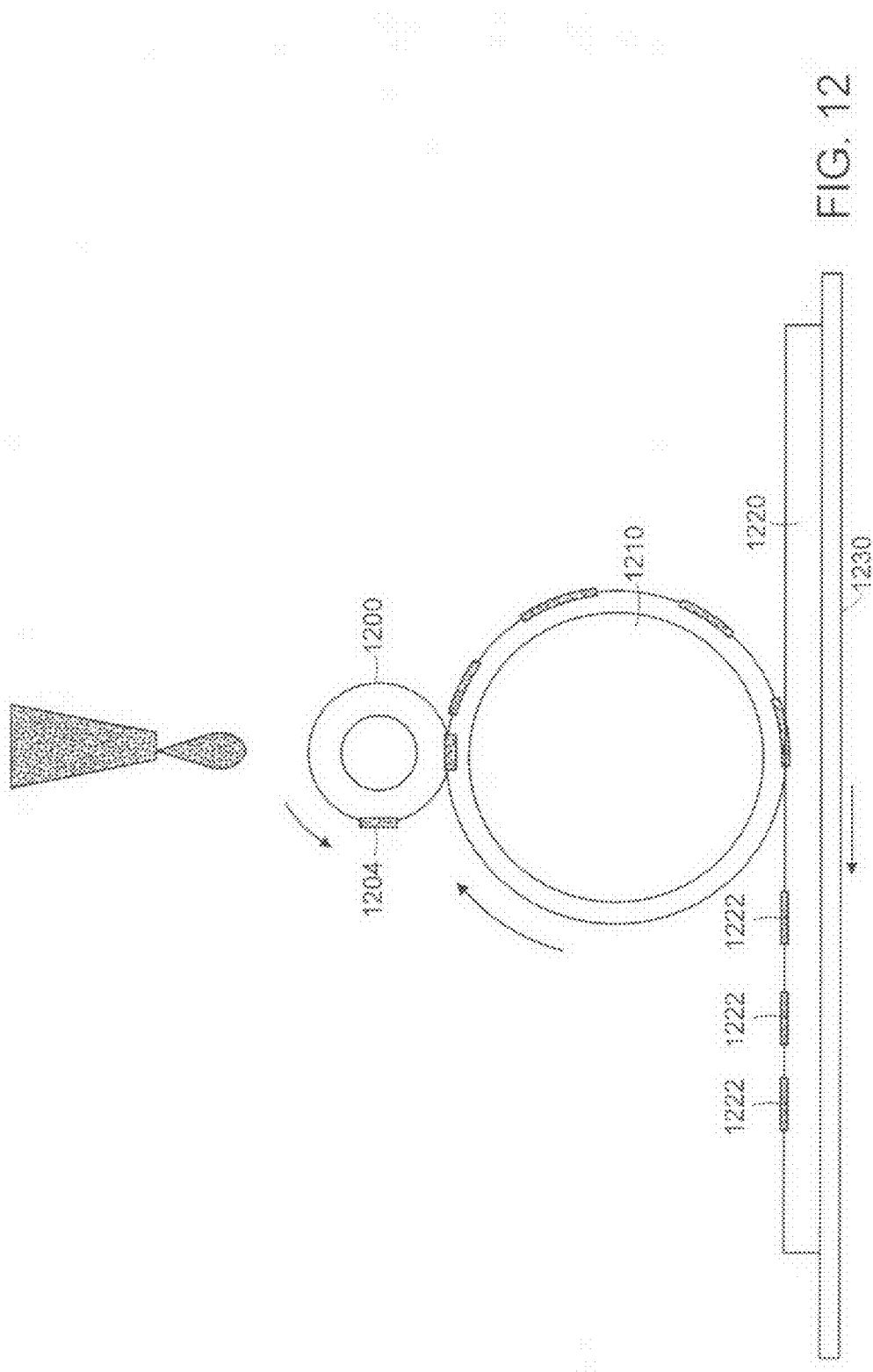
FIG. 12 is a diagram depicting an example of a system including a transfer surface and applicator for use in various embodiments of a method of the invention.

FIG. 12 illustrates an example in which the deposition process is embodied in a continuous line. The belt 1230 moves in a direction (shown by the arrow). A substrate, for example, a display panel, 1220 is carried on and moved in the same direction as the belt movement in a continuous line for fabricating, e.g., a light emitting device including semiconductor nanocrystals.

As shown, the transfer surface comprises a transfer surface 1200 that is formed in the shape of a cliché roller. The transfer surface is in contact with the applicator 1210. As the belt 1230 progresses, the substrate 1220 progresses to be placed in contact with the applicator 1210 and the applicator 1210 is rotated with a speed corresponding to a progression speed of the belt 1230. In the meantime, the transfer surface 1200 is also rotated with the rotation of the applicator 1210, so that the composition 1204 from the transfer surface 1200 is transferred to the applicator surface 1210 and thereafter compositions or nanomaterials (depending on whether the conditions and time are selected to achieve a wet or dry transfer, respectively) 1222 are deposited on the substrate 1220. The composition can be dispensed to the transfer surface from a micro-dispenser (as shown), from an array of micro-dispensers, or other known techniques.

When deposition onto one substrate is finished, a next substrate can be placed on the belt for contact by the applicator and the same processes are repeated, thereby depositing a pattern on a plurality of substrates by consecutive processes.

The substrate including the deposited nanomaterial 1222 can be transported to a subsequent line for subsequent processing.

Optional additional steps can be included in the method. Optionally, patterned or unpatterned nanomaterial can be deposited onto the substrate.

Alternative techniques can be used for depositing one or more compositions onto the tape include silk screening, etc.

Various aspects of the present invention will be further clarified by the following examples, which are intended to be exemplary of the present invention.

Example 1

Printing of 400 um Lines Comprising Semiconductor Nanocrystals Using TOSH Logica 150 Utilizing a Wet Transfer Pad Printing Process The process described in this example can be useful for printing directly on a substrate (that may include other layers or materials) or on a transfer surface or donor sheet for subsequent dry transfer.

Clichés: Standard pad printing etched polymer clichés can be used. In certain embodiments for depositing repeating patterns of two or more different nanomaterials (e.g., semiconductor nanocrystals), a separate cliché is preferably used for each different nanomaterial to be deposited on a substrate. For example, to print a repeating pattern of three different semiconductor nanocrystals for emitting red, green, and blue light, respectively, three different clichés are preferably used, one for each color. An example of a cliché pattern useful for printing repeating patterns of red, green, and blue, to print pixels for a display, includes a 400 um line geometry with 1500 um pitch. To create such clichés, the plates are exposed through a 150 dpi/90% line screen to produce a controlled etch depth of approximately 30 um.

Stamps: A stamp geometry with an 80 mm diameter contact area and 150 mm curved radius can be used with the above clichés. A standard pad printing industry silicone resin is used to cast the stamps having a Shore A durometer rating of 70.

Inks: Printing inks comprising semiconductor nanocrystals including a core/shell structure, size, and chemical compositions capable of emitting a desired color are dispersed in about 5 ml of nonane with no further dilution. 1 to 2 ml of ink is dispensed into standard pad printing ink cups.

Printing Process: The standard pad printing process to print a pattern of two, e.g., red and green, inks is carried out as follows:

1) A cliché pattern for each of the two colors to be printed is filled simultaneously with ink by ink cups at each printing station of the TOSH Logica 150.
2) Ink cups are retracted and a cliché pattern is picked by each of the stamps from the respective cliché
3) A first stamp transfers, e.g., red ink, to the substrate first.
4) The substrate moves to the second, e.g., green position, and a second stamp transfers green ink to the substrate.

Process Parameters: The process parameters for the printing equipment are determined based on the viscosity and volatility of the ink to be printed. The equipment printing parameters for, e.g., TOSH Logica 150, are based on an arbitrary scale of 1 to 5 (1 slowest, 5 fastest) and time delays measured in seconds. In general, parameters relating to pick up from the cliché can have a stronger effect on print quality than transfer parameters. In particular, for a nonane based ink, the time delay down on the cliché can have a strong effect on print quality. A delay down on the cliché allows liquid component of the ink in the cliché to be absorbed into the stamp. This modulation of the volume of the liquid component allows control of line uniformity and ink spreading on the stamp.

| Parameter | Machine Setting/Time | Machine Setting Selection Consideration(s) |
|---|---|---|
| Pick up | | |
| Cliché impact speed | 1 | Slow to prevent disturbance of ink in cliché This parameter can strongly affect print quality. |
| Time delay down on cliché | 30 sec | Long delay times allow liquid component of the ink to be absorbed into the stamp. This control of the liquid component can improve print quality. |
| Speed up from cliché | 5 | Maximized to prevent ink spreading before transfer |
| Delay before transfer | 0 | Minimized to prevent ink spreading before transfer |
| Transfer | | |
| Transfer impact speed | 1 | Found to have weak effect on print quality |
| Time delay down on substrate | 10 sec | Interaction with time delay down on cliché. Long delay times slightly improve print quality when coupled with long cliché delay times |
| Speed up from substrate | 5 | Slight improvement in print quality at high speeds |

Example 2

Printing Semiconductor Nanocrystals Using TOSH mi-microS Utilizing A Dry Transfer Pad Printing Process The process described in this example can be useful for printing directly on a substrate (that may include other layers or materials) or on a transfer surface or donor sheet for subsequent dry transfer.

A monolayer of semiconductor nanocrystals (capable of emitting red light upon excitation) is formed on a piece of silanized glass. The monolayer is formed by dispensing 220 micro-liters of a dispersion of semiconductor nanocrystals (having an optical density of 0.011) in hexane from a micropipette to a piece of silanized glass mounted in a spinner. The spinner settings are set at 3000 speed/5000 ramp/60 seconds. Immediately after dispensing the semiconductor nanocrystal dispersion, the spinner is started.

Silanizing can be carried out by known techniques. One technique involves first treating the substrates to be silanized with $O_2$ plasma for 5 minutes and immediately thereafter rinsing with deionized (DI) water for about a minute, to obtain a clean hydrolyzed substrate surfaces. A beaker including a mixture of 70 ml hexane, 10 ml $CCl_4$, and 2 ml (2 $CHCl_3$:3 $CCl_4$)$H_2O$ is placed in a sonicator including a ice/water mixture having a temperature <10° C. 200 µL of tichlorosilane is then added to the beaker. The clean substrates are loaded into a substrate carrier and placed in the beaker. The contents of the beaker is sonicated for about 24 minutes. After sonication, the substrate carrier is removed from the beaker. The substrates are thereafter removed and rinsed with chloroform then DI water (or alternatively chloroform, then acetone, then methanol (then water—especially effective on a hydrophic silane), and thereafter blown dry with nitrogen After spin-coating, the silanized glass including the spin-coated semiconductor nanocrystal layer is positioned in a TOSH mi-microS model pad printer at the location where the stamp would normally contact the cliché. An organic substrate (e.g., including a 50 nm thick layer of E105 on PEDOT-coated plain glass) is positioned in the pad printer at the location where the stamp makes print contact to the surface to be printed. A lens molded stamp (that can be prepared as generally described above and including a layer of parylene) is mounted in the pad printer, and semiconductor nanocrystals are printed from the silanized glass to the top of the organic substrate. Increases in contact times of the stamp with semiconductor nanocrystal coated glass when picking up semiconductor nanocrystals and of the stamp with the organic substrate when depositing or printed dots can improve transfer efficiency.

Methods in accordance with the invention provide advantages that can be particularly useful, for example, in depositing semiconductor nanocrystals in the fabrication of a light-emitting device (LED) including semiconductor nanocrystals.

As discussed above, in certain embodiments, the method of the invention can allow the patterned deposition of solution processable layers comprising nanomaterial (e.g., semiconductor nanocrystals, other nanoparticles, etc.) within a layered structure without disturbing the structure fidelity through the introduction of solvent to the device.

In addition, certain embodiments of the invention can be useful with existing backplane technology, and with off-the-shelf well known transport films.

The present invention is also expected to facilitate high throughput, since the nanomaterial can be introduced to the device in an singular process. Various embodiments of the invention are also expected to be compatible with processes for the manufacture of flexible displays, whether, for example, by roll-to-roll or flex-on-rigid batch mode processing.

Because semiconductor nanocrystals have narrow emission linewidths, are photoluminescent efficient, and emission wavelength tunable, they can be a desirable lumophore. The semiconductor nanocrystals optionally include organic ligands attached to the surface thereof. These zero-dimensional semiconductor structures show strong quantum confinement effects that can be harnessed in designing bottom-up chemical approaches to create complex heterostructures with electronic and optical properties that are tunable with the size and composition of the nanocrystals.

The size and composition of the semiconductor nanocrystals can be selected such that semiconductor nanocrystals emit photons at a predetermined wavelength of wavelength band in the far-visible, visible, infra-red or other desired portion of the spectrum. For example, the wavelength can be between 300 and 2,500 nm or greater, such as between 300 and 400 nm, between 400 and 700 nm, between 700 and 1100 nm, between 1100 and 2500 nm, or greater than 2500 nm.

The semiconductor nanocrystals can include semiconductor nanocrystals that emit light at the same or different wavelengths. By including an arrangement the semiconductor nanocrystals that emit light at different wavelengths, a multicolor pattern can be formed.

For example, a multicolor pattern can optionally include a repeating pattern comprising two or more different semiconductor nanocrystal materials that emit light at different wavelengths.

When two or more different color emitting compositions including nanomaterial are included as an emissive material of a display, each different color emitting nanomaterial can each independently include a plurality of semiconductor nanocrystals.

The method can include introducing onto a transfer surface a first nanomaterial including a plurality of semiconductor nanocrystals having an emission wavelength distinguishable from a second nanomaterial including a plurality of semiconductor nanocrystals.

The method can further include introducing a third or more nanomaterials, each including a plurality of semiconductor nanocrystals, on a transfer surface. Each of the third or more nanomaterials comprises a plurality of semiconductor nanocrystals that can have an emission wavelength distinguishable from that of the other nanomaterials. The first, second, third, and other nanomaterials including pluralities of semiconductor nanocrystals can be applied to the same or different transfer surfaces, in either case, to be deposited in overlapping or non-overlapping predefined regions of the substrate. The emission wavelengths of the first, second, third, and other nanomaterials comprising pluralities of semiconductor nanocrystals can be selected from an ultraviolet, blue, green, yellow, red, cyan, magenta, infrared emission, or other wavelength, or a combination thereof.

A feature of the pattern can have a dimension of less than 10 millimeters, less than 1 millimeter, less than 100 micrometers, or less than 1 micrometer. A feature of the pattern can have a dimension of at least 1 centimeter, at least 10 centimeters, or at least 100 centimeters.

The surface to which the semiconductor nanocrystals are applied is typically a substrate which includes one or more device layers in-between the substrate surface and patterned semiconductor nanocrystals. Additional device layers are typically subsequently disposed over the nanocrystals. Individual saturated color LEDs can be formed at multiple locations on a single substrate to form a display.

For example, the substrate can include a layer including a hole transport material over the electrode. The method can include forming a layer including an electron transporting material over the nanomaterial. A second electrode can be applied over the layer including an electron transporting material.

An embodiment of the invention including a dry transfer process of at least the nanomaterials from the applicator to the device structure is preferred when transferring semiconductor nanocrystals to an organic layer of a light-emitting device structure during device fabrication.

When depositing semiconductor nanocrystals to an inorganic layer of a light-emitting device structure, the possible reaction of the liquid of the composition with the inorganic layer can be less of a concern.

In certain embodiments including semiconductor nanocrystals, the semiconductor nanocrystals are deposited at a thickness of multiple monolayers or less, e.g., greater than three monolayers, three or less monolayers, two or less monolayers, a single monolayer, a partial monolayer, etc. The thickness of each deposited layer of semiconductor nanocrystals may vary. Preferably, the variation of the thickness at any point of the deposited nanocrystals is less than three monolayers, more preferably less than two monolayers, and most preferably less than one monolayer.

In some applications, the substrate can include a backplane. The backplane includes active or passive electronics for controlling or switching power to individual pixels. Including a backplane can be useful for applications such as displays, sensors, or imagers. In particular, the backplane can be configured as an active matrix, passive matrix, fixed format, direct drive, or hybrid. The display can be configured for still images, moving images, or lighting. A lighting display can provide white light, monochrome light, or color-tunable light.

The deposition method is scalable, and can allow inexpensive manufacturing of LEDs over a large surface area.

In certain embodiments, semiconductor nanocrystals are included in a light emitting device at a monolayer thickness. A monolayer can provide the beneficial light emission properties of semiconductor nanocrystals while minimizing the impact on electrical performance.

A light emitting device can include two layers separating two electrodes of the device. The material of one layer can be chosen based on the material's ability to transport holes, or the hole transporting layer (HTL). The material of the other layer can be chosen based on the material's ability to transport electrons, or the electron transporting layer (ETL). The electron transporting layer typically includes an electroluminescent layer. When a voltage is applied, one electrode injects holes (positive charge carriers) into the hole transporting layer, while the other electrode injects electrons into the electron transporting layer. The injected holes and electrons each migrate toward the oppositely charged electrode. When an electron and hole localize on the same molecule, an exciton is formed, which can recombine to emit light.

When the electron and hole localize on a nanocrystal, emission can occur at an emission wavelength. The emission has a frequency that corresponds to the band gap of the quantum confined semiconductor material. The band gap is a function of the size of the nanocrystal. Nanocrystals having small diameters can have properties intermediate between molecular and bulk forms of matter. For example, nanocrystals based on semiconductor materials having small diameters can exhibit quantum confinement of both the electron and hole in all three dimensions, which leads to an increase in the effective band gap of the material with decreasing crystallite size. Consequently, both the optical absorption and emission of nanocrystals shift to the blue, or to higher energies, as the size of the crystallites decreases.

The emission from the nanocrystal can be a narrow Gaussian emission band that can be tuned through the complete wavelength range of the ultraviolet, visible, or infrared regions of the spectrum by varying the size of the nanocrystal, the composition of the nanocrystal, or both. For example, CdSe can be tuned in the visible region and InAs can be tuned in the infrared region. The narrow size distribution of a population of nanocrystals can result in emission of light in a narrow spectral range. The population can be monodisperse and can exhibit less than a 15% rms deviation in diameter of the nanocrystals, preferably less than 10%, more preferably less than 5%. Spectral emissions in a narrow range of no greater than about 75 nm, preferably 60 nm, more preferably 40 nm, and most preferably 30 nm full width at half max (FWHM) can be observed. The breadth of the emission decreases as the dispersity of nanocrystal diameters decreases. Semiconductor nanocrystals can have high emission quantum efficiencies such as greater than 10%, 20%, 30%, 40%, 50%, 60%, 70%, or 80%.

Figure 13:
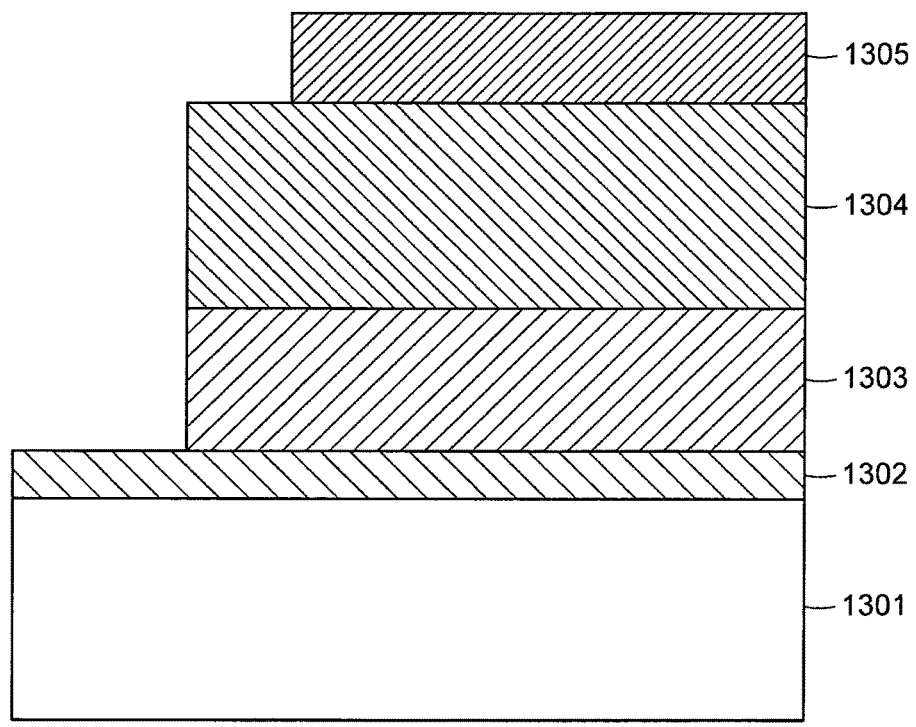
FIG. 13 is a schematic drawing depicting a light-emitting device.

A light emitting device can have a structure such as shown in FIG. 13, in which a first electrode 1302, a first layer 1303 in contact with the electrode 1302, a second layer 1304 in contact with the layer 1303, and a second electrode 1305 in contact with the second layer 1304. First layer 1303 can be a hole transporting layer and second layer 1304 can be an electron transporting layer. At least one layer can be non-polymeric. Alternatively, a separate emissive layer (not shown in FIG. 13) can be included between the hole transporting layer and the electron transporting layer. One of the electrodes of the structure is in contact with a substrate 1301. Each electrode can contact a power supply to provide a voltage across the structure. Electroluminescence can be produced by the emissive layer of the heterostructure when a voltage of proper polarity is applied across the heterostructure. First layer 1303 can include a plurality of semiconductor nanocrystals, for example, a substantially monodisperse population of nanocrystals. Alternatively, a separate emissive layer can include the plurality of nanocrystals. In certain embodiments, a layer that includes semiconductor nanocrystals is preferably a monolayer of nanocrystals.

The substrate 1301 can be opaque or transparent. The substrate can be rigid or flexible. The substrate can be plastic, metal or glass. The first electrode can be, for example, a high work function hole-injecting conductor, such as an indium tin oxide (ITO) layer. Other first electrode materials can include gallium indium tin oxide, zinc indium tin oxide, titanium nitride, or polyaniline. The second electrode can be, for example, a low work function (e.g., less than 4.0 eV), electron-injecting, metal, such as Al, Ba, Yb, Ca, a lithium-aluminum alloy (Li:Al), aluminum-lithium fluoride (Al:LiF), or a magnesium-silver alloy (Mg:Ag). The second electrode, such as Mg:Ag, can be covered with an opaque protective metal layer, for example, a layer of Ag for protecting the cathode layer from atmospheric oxidation, or a relatively thin layer of substantially transparent ITO. The first electrode can have a thickness of about 500 Angstroms to 4000 Angstroms. The first layer can have a thickness of about 50 Angstroms to about 1000 Angstroms. The second layer can have a thickness of about 50 Angstroms to about 1000 Angstroms. The second electrode can have a thickness of about 50 Angstroms to greater than about 1000 Angstroms.

The electron transporting layer (ETL) can be a molecular matrix. The molecular matrix can be non-polymeric. The molecular matrix can include a small molecule, for example, a metal complex. For example, the metal complex can be a metal complex of 8-hydroxyquinoline. The metal complex of 8-hydroxyquinoline can be an aluminum, gallium, indium, zinc or magnesium complex, for example, aluminum tris(8-hydroxyquinoline) ($Alq_3$). Other classes of materials in the ETL can include metal thioxinoid compounds, oxadiazole metal chelates, triazoles, sexithiophene derivatives, pyrazine, and styrylanthracene derivatives. In certain embodiments, 2,2',2''-(1,3,5-benzinetriyl)-tris(1-phenyl-1-H-benzimidazole) (TPBi) can be preferred. The hole transporting layer can include an organic chromophore. The organic chromophore can be a phenyl amine, such as, for example, N,N'-diphenyl-N,N'-bis(3-methylphenyl)-(1,1'-biphenyl)-4,4'-diamine (TPD), 4-4'-N,N'-dicarbazolyl-biphenyl (CBP), 4,4-. bis[N-(1-naphthyl)-N-phenylamino]biphenyl (NPD), etc. In certain embodiments, N,N'-Bis(3-methylphenyl)-N,N'-bis-(phenyl)-spiro (spiro-TPD) can be preferred. The HTL can include a polyaniline, a polypyrrole, a poly(phenylene vinylene), copper phthalocyanine, an aromatic tertiary amine or polynuclear aromatic tertiary amine, a 4,4'-bis(9-carbazolyl)-1,1'-biphenyl compound, or an N,N,N',N'-tetraarylbenzidine.

The layers can be deposited on a surface of one of the electrodes by spin coating, dip coating, vapor deposition, or other thin film deposition methods. See, for example, M. C. Schlamp, et al., J. Appl. Phys., 82, 5837-5842, (1997); V. Santhanam, et al., Langmuir, 19, 7881-7887, (2003); and X. Lin, et al., J. Phys. Chem. B, 105, 3353-3357, (2001), each of which is incorporated by reference in its entirety. The second electrode can be sandwiched, sputtered, or evaporated onto the exposed surface of the solid layer. One or both of the electrodes can be patterned. The electrodes of the device can be connected to a voltage source by electrically conductive pathways. Upon application of the voltage, light is generated from the device.

Preferably, semiconductor nanocrystals are processed in a controlled (oxygen-free and moisture-free) environment, preventing the quenching of luminescent efficiency during the fabrication process.

Other multilayer structures may be used to improve the device performance (see, for example, U.S. patent application Ser. Nos. 10/400,907 and 10/400,908, filed Mar. 28, 2003, each of which is incorporated by reference in its entirety). A blocking layer, such as an electron blocking layer (EBL), a hole blocking layer (HBL) or a hole and electron blocking layer (eBL), can be introduced in the structure. A blocking layer can include 3-(4-biphenylyl)-4-phenyl-5-tert-butylphenyl-1,2,4-triazole (TAZ), 3,4,5-triphenyl-1,2,4-triazole, 3,5-bis(4-tert-butylphenyl)-4-phenyl-1,2,4-triazole, bathocuproine (BCP), 4,4',4''-tris{N-(3-methylphenyl)-N-phenylamino}triphenylamine (m-MTDATA), polyethylene dioxythiophene (PEDOT), 1,3-bis(5-(4-diphenylamino)phenyl-1,3,4-oxadiazol-2-yl)benzene, 2-(4-biphenylyl)-5-(4-tert-butylphenyl)-1,3,4-oxadiazole, 1,3-bis[5-(4-(1,1-dimethylethyl)phenyl)-1,3,4-oxadiazol-2-yl]benzene, 1,4-bis(5-(4-diphenyl-amino)phenyl-1,3,4-oxadiazol-2-yl)benzene, or 1,3,5-tris[5-(4-(1,1-dimethylethyl)-phenyl)-1,3,4-oxadiazol-2-yl]benzene. A hole-injection layer (HIL) (e.g., Poly(3,4-ethylenedioxythiophene) poly(styrenesulfonate) (PEDOT PSS)) can optionally be introduced between the first electrode and HTL.

An example of one embodiment of a device structure (from bottom to top) can include a 150 nm indium tin oxide (ITO) anode layer, a 70 nm Poly(3,4-ethylenedioxythiophene) poly (styrenesulfonate) (PEDOT:PSS) hole injection layer (HIL), a 50 nm N,N'-Bis(3-methylphenyl)-N,N'-bis-(phenyl)-spiro (spiro-TPD) hole transport layer, a 5-10 nm semiconductor nanocrystal emissive layer, a 50 nm 2,2',2''-(1,3,5-benzinetriyl)-tris(1-phenyl-1-H-benzimidazole) (TPBi) hole-blocking/electron transporting layer and a 0.5 nm LiF/100 nm Al cathode layer. The ITO layer can be deposited, patterned and cleaned using industry standard techniques. The PEDOT:PSS layer can be deposited by spin coating followed by bake out at 125 C for 20 minutes. All other organic and metal layers can be thermally evaporated in a high vacuum chamber. Prior to testing and operation the entire device is preferably encapsulated using, for example, a sealant in a dry nitrogen environment (<1 ppm $O_2$, <1 ppm $H_2O$). A sealant of the type used in OLEDs is one example of a sealant that can be used.

Examples of semiconductor nanocrystals useful in the above described device include, for example, and without limitation, those described in U.S. Patent Application Nos. 60/825,373, filed 12 Sep. 2006 and 60/825,374, filed 12 Sep. 2006.

The performance of light emitting devices can be improved by increasing their efficiency, narrowing or broadening their emission spectra, or polarizing their emission. See, for example, Bulovic et al., Semiconductors and Semimetals 64, 255 (2000), Adachi et al., Appl. Phys. Lett. 78, 1622 (2001), Yamasaki et al., Appl. Phys. Lett. 76, 1243 (2000), Dirr et al., Jpn. J. Appl. Phys. 37, 1457 (1998), and D'Andrade et al., MRS Fall Meeting, BB6.2 (2001), each of which is incorporated herein by reference in its entirety. Nanocrystals can be included in efficient hybrid organic/inorganic light emitting devices.

The narrow FWHM of nanocrystals can result in saturated color emission. This can lead to efficient nanocrystal-light emitting devices even in the red and blue parts of the visible spectrum, since in nanocrystal emitting devices no photons are lost to infrared and UV emission. The broadly tunable, saturated color emission over the entire visible spectrum of a single material system is unmatched by any class of organic chromophores (see, for example, Dabbousi et al., J. Phys. Chem. 101, 9463 (1997), which is incorporated by reference in its entirety). A monodisperse population of nanocrystals will emit light spanning a narrow range of wavelengths. A device including more than one size of nanocrystal can emit light in more than one narrow range of wavelengths. The color of emitted light perceived by a viewer can be controlled by selecting appropriate combinations of nanocrystal sizes and materials in the device. The degeneracy of the band edge energy levels of nanocrystals facilitates capture and radiative recombination of all possible excitons, whether generated by direct charge injection or energy transfer. The maximum theoretical nanocrystal-light emitting device efficiencies are therefore comparable to the unity efficiency of phosphorescent organic light emitting devices. The excited state lifetime ($\tau$) of the nanocrystal is much shorter ($\tau$~10 ns) than a typical phosphor ($\tau$>0.5 µs), enabling nanocrystal-light emitting devices to operate efficiently even at high current density.

Devices can be prepared that emit visible or infrared light. The size and material of a semiconductor nanocrystal can be selected such that the nanocrystal emits visible or infrared light of a selected wavelength. The wavelength can be between 300 and 2,500 nm or greater, for instance between 300 and 400 nm, between 400 and 700 nm, between 700 and 1100 nm, between 1100 and 2500 nm, or greater than 2500 nm.

Individual devices can be formed at multiple locations on a single substrate to form a display. The display can include devices that emit at different wavelengths. By patterning the substrate with arrays of different color-emitting semiconductor nanocrystals, a display including pixels of different colors can be formed.

Besides being useful to deposit nanomaterials in fabricating of display devices, methods in accordance with the invention can be used to deposit various other materials, especially other materials comprising nanoparticles, in fabricating a variety of lighting, electronic, or optoelectronic devices.

For example, an unpatterned layer comprising nanomaterial comprising a white light-emitting mixture of semiconductor nanocrystals can be deposited onto a substrate by a method in accordance with the invention. The mixture includes semiconductor nanocrystals with different sizes and compositions which can simultaneously emit light at different wavelengths to achieve white light emission. The mixture of semiconductor nanocystals are deposited as a layer in a device structure that also includes a hole transport layer and/or an electron transport layer. The device may used to provide general lighting or may be included in a display, e.g., a liquid crystal display, to provide backlighting. Alternatively, the device may further include a color filter to provide a full-color display. See U.S. Patent Application No. 20060043361 entitled "White Light-Emitting Organic-Inorganic Hybrid Electroluminescence Device Comprising Semiconductor Nanocrystals", of Lee et al., published 2 Mar. 2006, the disclosure of which is hereby incorporated herein by reference in its entirety.

Another example includes depositing nanomaterial comprising a plurality of semiconductor nanocrystals by a method in accordance with the invention in fabrication of a photodetector device or array of photodetector devices. A photodetector device includes one or more nanomaterials comprising a plurality of semiconductor nanocrystals which are selected based upon absorption properties. When included in a photodetector, semiconductor nanocrystals are engineered to produce a predetermined electrical response upon absorption of a particular wavelength, typically in the IR or MIR region of the spectrum. Examples of photodetector devices including semiconductor nanocrystals are described in "A Quantum Dot Heterojunction Photodetector" by Alexi Cosmos Arango, Submitted to the Department of Electrical Engineering and Computer Science, in partial fulfillment of the requirements for the degree of Masters of Science in Computer Science and Engineering at the Massachusetts Institute of Technology, February 2005, the disclosure of which is hereby incorporated herein by reference in its entirety.

In one embodiment, a method of fabricating photodetector device includes applying a layer including nanomaterial to an applicator from a transfer surface and depositing nanomaterial onto a substrate. In one embodiment, the nanomaterial including a plurality of semiconductor nanocrystals can be deposited on the substrate as an unpatterned layer.

In another embodiment, a method of fabricating an array of photodetector devices includes applying a layer comprising nanomaterial to an applicator from a transfer surface and depositing nanomaterial onto a substrate. In one embodiment, the nanomaterial including a plurality of semiconductor nanocrystals can be deposited on the substrate as a patterned layer. The substrate can further include an electrode. A second electrode can be deposited over the nanomaterial. Optionally, an electron transport layer can be included between the nanomaterial and the cathode electrode and/or a hole transport layer can be included between the anode electrode and the nanomaterial.

A method of fabricating a photodetector device or array of devices can optionally include depositing one or more nanomaterials in a predetermined arrangement (patterned or unpatterned). As discussed above, nanomaterial can optionally be included in a composition.

Methods in accordance with the invention can also be used in deposition nanomaterials in the fabrication of memory devices. An example of a nonvolatile device is described in U.S. patent application Ser. No. 10/958,659, entitled "Non-Volatile Memory Device", of Bawendi et al., filed 6 Oct. 2004, the disclosure of which is hereby incorporated herein by reference in its entirety. As discussed above, nanomaterial can optionally be included in a composition.

Other techniques, methods and applications that may be useful with the present invention are described in, U.S. Provisional Patent Application 60/792,084, of Maria J. Anc, for "Methods Of Depositing Material, Methods Of Making A Device, And System", filed 14 Apr. 2006; U.S. Provisional Patent Application 60/792,086, of Marshall Cox, et al, for "Methods Of Depositing Nanomaterial & Methods Of Making A Device", filed on 14 Apr. 2006, U.S. Provisional Patent Application 60/792,167 of Seth Coe-Sullivan, et al, for "Articles For Depositing Materials, Transfer Surfaces, And Methods", filed on 14 Apr. 2006; U.S. Provisional Patent Application No. 60/792,083 of LeeAnn Kim et al., for "Applicator For Depositing Materials And Methods", filed 14 Apr. 2006; and U.S. Provisional Patent Application No. 60/793,990 of LeeAnn Kim et al., for "Applicator For Depositing Materials And Methods", filed 21 Apr. 2006; the disclosures of each of which is hereby incorporated herein by reference in its entirety.

As used herein, "top" and "bottom" are relative positional terms, based upon a location from a reference point. For example, "top" of a device structure means farthest away from the substrate, while "bottom" means closest to the substrate. For example, for a light-emitting device that optionally includes two electrodes, the bottom electrode is the electrode closest to the substrate, and is generally the first electrode fabricated; the top electrode is the electrode that is more remote from the substrate, on the top side of the light-emitting material. The bottom electrode has two surfaces, a bottom surface closest to the substrate, and a top surface further away from the substrate. Where, e.g., a first layer is described as disposed or deposited "over" a second layer, the first layer is disposed further away from substrate. There may be other layers between the first and second layer, unless it is otherwise specified. For example, a cathode may be described as "disposed over" an anode, even though there are various organic and/or inorganic layers in between.

As used herein, the singular forms "a", "an" and "the" include plural unless the context clearly dictates otherwise. Thus, for example, reference to an emissive material includes reference to one or more of such materials.

When an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

In various instances herein, a semiconductor nanocrystal is referred to by the term "nanocrystal".

It will be apparent to those skilled in the art that various modifications can be made in the methods, articles and systems of the present invention without departing from the spirit or scope of the invention. Thus, it is intended that the present invention cover modifications and variations of this invention provided they come within the scope of the appended claims and their equivalents.

All the patents and publications mentioned above and throughout are incorporated in their entirety by reference herein.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

What is claimed is:

1. A method of forming a device comprising:
    applying a patterned arrangement including a composition comprising nanomaterial comprising a plurality of semiconductor nanocrystals on a surface of an applicator from a transfer surface comprising contacting the surface of the applicator and the patterned arrangement disposed on a surface of the transfer surface;
    contacting the surface of the applicator to a substrate including a first electrode, thereby transferring at least a portion of the patterned arrangement onto the substrate; and
    arranging a second electrode opposed to the first electrode.

2. A method in accordance with claim 1 wherein the semiconductor nanocrystals comprise a core/shell structure.

3. A method in accordance with claim 1 wherein the plurality of semiconductor nanocrystals forms a layer comprising the patterned arrangement on the substrate.

4. A method in accordance with 3 wherein the layer is a multilayer of semiconductor nanocrystals.

5. A method in accordance with claim 3 wherein the layer is a monolayer of semiconductor nanocrystals.

6. A method in accordance with claim 3 wherein the layer is a partial monolayer of semiconductor nanocrystals.

7. A method in accordance with claim 1 wherein the patterned arrangement is transferred onto the substrate.

8. A method in accordance with claim 1 further comprising applying a second composition comprising nanomaterial on a surface of a second applicator from a second transfer surface; and
    contacting the surface of the second applicator to the substrate, thereby transferring at least a portion of the second nanomaterial of the composition onto the substrate.

9. A method in accordance with claim 8 wherein the first nanomaterial and the second nanomaterial each independently include a plurality of semiconductor nanocrystals.

10. A method in accordance with claim 9 wherein the first plurality of semiconductor nanocrystals have an emission wavelength distinguishable from the second plurality of semiconductor nanocrystals.

11. A method in accordance with claim 1 wherein the substrate includes a layer including a hole transport material over the first electrode.

12. A method in accordance with claim 11 further comprising forming a layer including an electron transporting material over the nanomaterial.

13. A method in accordance with claim 12 wherein the second electrode is applied over the layer including the electron transporting material.

14. A method in accordance with claim 10 further comprising applying a one or more additional compositions comprising nanomaterial on a surface of a one or more additional applicators from one or more additional transfer surfaces, wherein each additional composition is applied to a separate applicator from a separate transfer surface; and
    contacting the surface of each one or more additional applicators to the substrate, thereby transferring at least a portion of the one or more additional compositions comprising plurality of semiconductor nanocrystals onto the substrate.

15. A method in accordance with claim 1 wherein the transfer surface is a cliché.

16. A method in accordance with claim 1 wherein the transfer surface includes one or more grooves.

17. A method in accordance with claim 1 wherein the transfer surface is surface treated.

18. A method in accordance with claim 1 further comprising modifying the surface of the applicator before placing the nanomaterial on the surface of the applicator.

19. A method in accordance with claim 18 wherein modifying the surface of the applicator includes contacting the surface of the applicator with a surface chemistry composition selected to release at least a portion of the nanomaterial from the applicator upon contact with a substrate.

20. A method in accordance with claim 19 wherein the surface chemistry composition includes an aromatic organic polymer.

21. A method in accordance with claim 10 further comprising applying one or more additional pluralities of semiconductor nanocrystals on a surface of one or more additional applicators from one or more additional transfer surfaces; and
    contacting the surface of each of the one or more additional applicators to the substrate, thereby transferring at least a portion of the one or more additional pluralities of semiconductor nanocrystals onto the substrate.

22. A method in accordance with claim 21 wherein each of the one or more additional pluralities of semiconductor nanocrystals have an emission wavelength distinguishable from the wavelengths of the other pluralities of semiconductor nanocrystals.

23. A method in accordance with claim 22 wherein the each of the pluralities of semiconductor nanocrystals are applied in non-overlapping predefined regions of the substrate.

24. A method in accordance with claim 22 wherein the emission wavelengths of each of the pluralities of semiconductor nanocrystals are selected from an ultraviolet, blue, green, yellow, red, or infrared emission wavelength, or a combination thereof.

25. A method in accordance with claim 23 wherein the emission wavelengths of each of the pluralities of semiconductor nanocrystals are selected from an ultraviolet, blue, green, yellow, red, or infrared emission wavelength, or a combination thereof.

26. A method in accordance with claim 7 wherein a feature of the pattern has a dimension of less than 10 millimeters.

27. A method in accordance with claim 7, wherein a feature of the pattern has a dimension of less than 1 millimeter.

28. A method in accordance with claim 7 wherein a feature of the pattern has a dimension of less than 100 micrometers.

29. A method in accordance with claim 7 wherein a feature of the pattern has a dimension of less than 1 micrometer.

30. A method in accordance with claim 7 wherein a feature of the pattern has a dimension of at least 1 centimeter.

31. A method in accordance with claim 7 wherein a feature of the pattern has a dimension of at least 10 centimeters.

32. A method in accordance with claim 14 wherein each of the nanomaterials independently includes a plurality of semiconductor nanocrystals.

33. A method in accordance with claim 32 wherein each of the nanomaterials has an emission wavelength distinguishable from each of the other nanomaterials.

34. A method in accordance with claim 33 wherein each of the nanomaterials is applied in non-overlapping predefined regions of the substrate.

35. A method in accordance with claim 33 wherein the emission wavelength of each nanomaterial is selected from an ultraviolet, blue, green, yellow, red, cyan, magenta, infrared emission wavelength, or a combination thereof.

* * * * *